(12) United States Patent
Jung et al.

(10) Patent No.: US 10,192,966 B2
(45) Date of Patent: Jan. 29, 2019

(54) SEMICONDUCTOR DEVICES INCLUDING RECESSED GATE ELECTRODE PORTIONS

(71) Applicant: Samsung Electronics Co., Ltd., Suwon-si, Gyeonggi-do (KR)

(72) Inventors: Hyunho Jung, Seoul (KR); Jeongyun Lee, Yongin-si (KR); Taesoon Kwon, Suwon-si (KR); Kyungseok Min, Yongin-si (KR); Geumjung Seong, Seoul (KR); Bora Lim, Seoul (KR); A-Reum Ji, Hwaseong-si (KR); Seungsoo Hong, Incheon (KR)

(73) Assignee: Samsung Electronics Co., Inc. (KR)

( * ) Notice: Subject to any disclaimer, the term of this patent is extended or adjusted under 35 U.S.C. 154(b) by 0 days.

(21) Appl. No.: 15/692,560

(22) Filed: Aug. 31, 2017

(65) Prior Publication Data

US 2018/0240881 A1    Aug. 23, 2018

(30) Foreign Application Priority Data

Feb. 20, 2017    (KR) .......................... 10-2017-0022372

(51) Int. Cl.
*H01L 29/423*    (2006.01)
*H01L 27/092*    (2006.01)
*H01L 29/06*    (2006.01)

(52) U.S. Cl.
CPC ...... *H01L 29/4236* (2013.01); *H01L 27/0924* (2013.01); *H01L 29/0653* (2013.01)

(58) Field of Classification Search
CPC .................... H01L 29/4236; H01L 21/823456
See application file for complete search history.

(56) References Cited

U.S. PATENT DOCUMENTS

| | | |
|---|---|---|
| 9,219,153 B2 | 12/2015 | Xie et al. |
| 9,293,459 B1 | 3/2016 | Cheng et al. |
| 9,425,288 B2 | 8/2016 | Zhong et al. |
| 9,461,043 B1 | 10/2016 | Chang et al. |
| 2013/0026572 A1* | 1/2013 | Kawa .................. H01L 27/0207 257/347 |

(Continued)

*Primary Examiner* — Tom Thomas
*Assistant Examiner* — John Bodnar
(74) *Attorney, Agent, or Firm* — Ward and Smith, P.A.

(57) ABSTRACT

A semiconductor device can include a first active pattern on a substrate, the first active pattern including a plurality of first active regions that protrude from the substrate. A second active pattern can be on the substrate including a plurality of second active regions that protrude from the substrate. A first gate electrode can include an upper portion that extends over the first active pattern at a first height and include a recessed portion that extends over the first active pattern at a second height that is lower than the first height of the first gate electrode. A second gate electrode can include an upper portion that extends over the second active pattern at a first height and include a recessed portion that extends over the second active pattern at a second height that is lower than the first height of the second gate electrode. An insulation pattern can be located between, and directly adjacent to, the recessed portion of the first gate electrode and the recessed portion of the second gate electrode, the insulation pattern electrically isolating the first and second gate electrodes from one another.

18 Claims, 40 Drawing Sheets

(56) References Cited

U.S. PATENT DOCUMENTS

| | | | |
|---|---|---|---|
| 2016/0133632 A1* | 5/2016 | Park | H01L 21/823828 257/369 |
| 2016/0181425 A1 | 6/2016 | Bai et al. | |
| 2016/0225764 A1 | 8/2016 | Chang et al. | |
| 2016/0233298 A1 | 8/2016 | Webb et al. | |
| 2016/0247728 A1 | 8/2016 | You et al. | |

* cited by examiner

SEMICONDUCTOR DEVICES INCLUDING RECESSED GATE ELECTRODE PORTIONS

CROSS-REFERENCE TO RELATED APPLICATIONS

This U.S. non-provisional patent application claims priority under 35 U.S.C. § 119 of Korean Patent Application No. 10-2017-0022372 filed on Feb. 20, 2017, the entire contents of which are hereby incorporated herein by reference.

BACKGROUND

The present inventive concept relates to semiconductor devices and methods of manufacturing the same.

Semiconductor devices may be categorized as semiconductor memory devices that store data, semiconductor logic devices that perform processing operations on data, and hybrid semiconductor devices that include both memory and logic elements. Semiconductor devices have been increasingly called on to provide greater reliability, higher operating speeds, and/or multifunctional capabilities, which may increase the complexity of those devices.

SUMMARY

Embodiments according to the present inventive concept can provide semiconductor devices including recessed gate electrode portions. Pursuant to these embodiments according to the inventive concept, a semiconductor device can include a first active pattern and a second active pattern on a substrate. A first gate electrode and a second gate electrode can respective extend across the first active pattern and the second active pattern. An insulation pattern can be located between the first and second gate electrodes to separate the first and second gate electrodes from one another, where the first gate electrode, the insulation pattern, and the second gate electrode are arranged along a first direction. Further, the first gate electrode can include a first part extending in the first direction and a second part between the first part and the insulation pattern, the second part including a top surface having a height lower than a height of a top surface of the first part closest to the second part.

In some embodiments according to the inventive concept, a semiconductor device can include a PMOSFET region and an NMOSFET region on a substrate, a first gate electrode extending across the PMOSFET region and a second gate electrode extending across the NMOSFET region. An insulation pattern can be located between the first and second gate electrodes where each of the first and second gate electrodes includes a recessed top portion adjacent to the insulation pattern relative to respective portions of the first and second gate electrodes that are remote from the insulation pattern.

In some embodiments according to the inventive concept, a semiconductor device can include a first active pattern on a substrate, the first active pattern including a plurality of first active regions that protrude from the substrate. A second active pattern can be on the substrate including a plurality of second active regions that protrude from the substrate. A first gate electrode can include an upper portion that extends over the first active pattern at a first height and include a recessed portion that extends over the first active pattern at a second height that is lower than the first height of the first gate electrode. A second gate electrode can include an upper portion that extends over the second active pattern at a first height and include a recessed portion that extends over the second active pattern at a second height that is lower than the first height of the second gate electrode. An insulation pattern can be located between, and directly adjacent to, the recessed portion of the first gate electrode and the recessed portion of the second gate electrode, the insulation pattern electrically isolating the first and second gate electrodes from one another.

DETAILED DESCRIPTION OF EMBODIMENTS ACCORDING TO THE INVENTIVE CONCEPT

Figure 1:
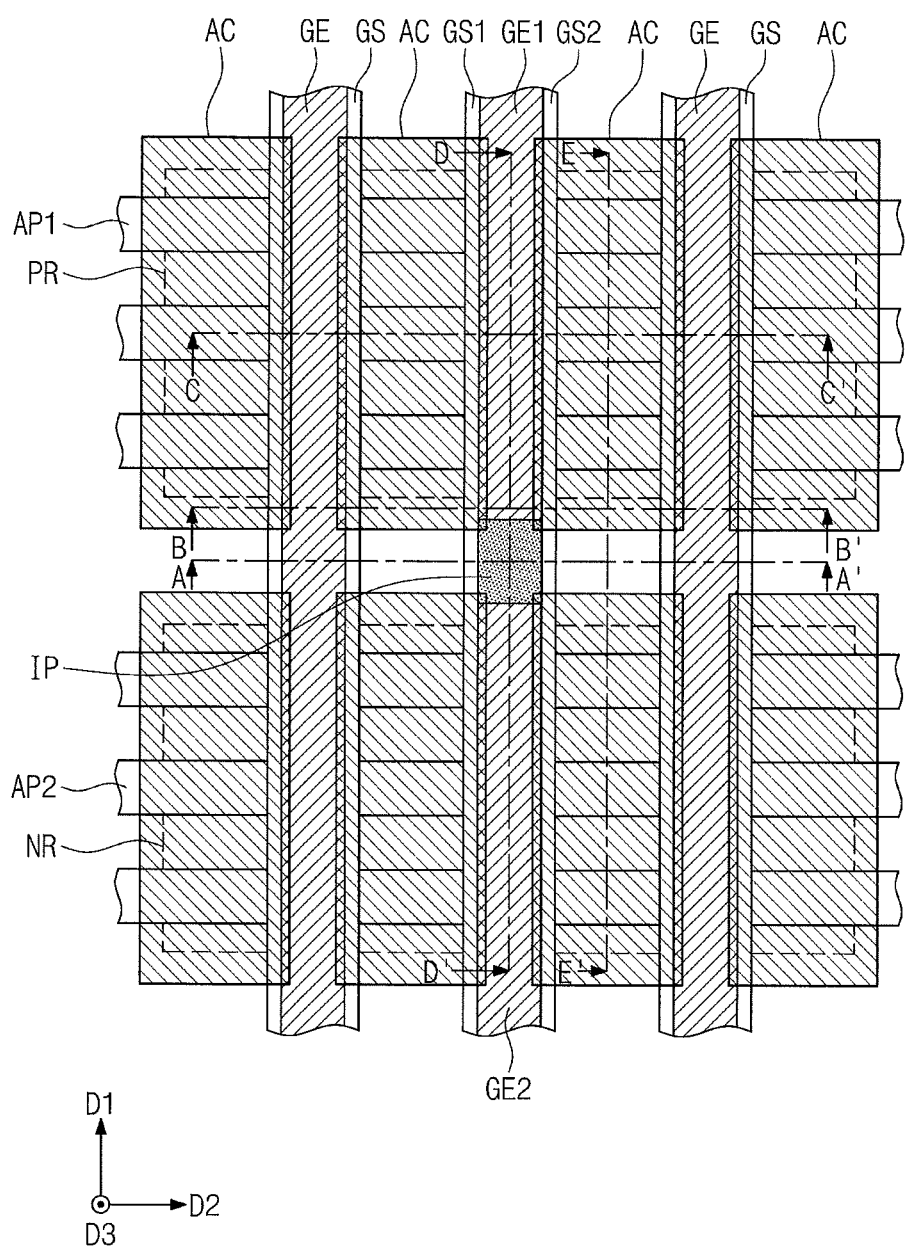
FIG. 1 is a plan view of a semiconductor device according to exemplary embodiments of the present inventive concept.

FIG. 1 is a plan view for explaining a semiconductor device according to exemplary embodiments of the present inventive concept. FIGS. 2A to 2E are cross-sectional views respectively taken along lines A-A', B-B', C-C', D-D', and E-E' of FIG. 1. FIG. 3 is a perspective view illustrating first and second gate electrodes and an insulation pattern according to exemplary embodiments of the present inventive concept.

Referring to FIGS. 1, 2A to 2E, and 3, device isolation layers ST may be provided at an upper portion of a substrate 100. The device isolation layers ST may define a PMOSFET region PR and an NMOSFET region NR. The substrate 100 may be a compound semiconductor substrate or a semiconductor substrate including silicon, germanium, silicon-germanium, etc. The device isolation layers ST may include an insulating material such as a silicon oxide layer.

The PMOSFET region PR and the NMOSFET region NR may be spaced apart from each other across the device isolation layer ST in a first direction D1 parallel to a top surface of the substrate 100. The PMOSFET region PR and the NMOSFET region NR may extend in a second direction D2 crossing the first direction D1. The device isolation layer ST between the PMOSFET and NMOSFET regions PR and NR may be deeper than the device isolation layers ST between active patterns AP1 and AP2.

The PMOSFET and NMOSFET regions PR and NR may be a logic cell region that includes logic transistors constituting a logic circuit of a semiconductor device. For example, the logic cell region of the substrate 100 may be provided thereon with logic transistors constituting a processor core or an I/O terminal. The PMOSFET and NMOSFET regions PR and NR may include at least one of the logic transistors.

Alternatively, the PMOSFET and NMOSFET regions PR and NR may constitute a memory cell region for storing data. For example, the memory cell region of the substrate 100 may be provided thereon with memory cell transistors constituting a plurality of SRAM cells. The PMOSFET and NMOSFET regions PR and NR may include at least one of the memory cell transistors. The present inventive concept, however, is not limited thereto.

The PMOSFET and NMOSFET regions PR and NR may be provided thereon with a plurality of the active patterns AP1 and AP2 extending in the second direction D2. The active patterns AP1 and AP2 may include first active patterns AP1 on the PMOSFET region PR and second active patterns AP2 on the NMOSFET region NR. The first and second active patterns AP1 and AP2 may be portions of the substrate 100 that protrude from the top surface of the substrate 100. The first and second active patterns AP1 and AP2 may be arranged along the first direction D1.

A first trench TR1 may be defined between neighboring first active patterns AP1, and a second trench TR2 may be defined between neighboring second active patterns AP2. In some embodiments according to the inventive concept, the device isolation layers ST may fill the first and second trenches TR1 and TR2. The device isolation layers ST may define the first and second active patterns AP1 and AP2. The device isolation layers ST may directly cover lower sidewalls of each of the first and second active patterns AP1 and AP2. Three first active patterns AP1 are illustrated on the PMOSFET region PR and three second active patterns AP2 are illustrated on the NMOSFET region NR, but the present inventive concept is not limited thereto.

The first and second active patterns AP1 and AP2 may have their upper portions protruding normal to the device isolation layers ST. Each upper portion of the first and second active patterns AP1 and AP2 may be shaped like a fin protruding between a pair of the device isolation layers ST.

First channel regions CH1 and first source/drain regions SD1 may be provided at the upper portions of the first active patterns AP1. The first source/drain regions SD1 may be p-type impurity regions. Each of the first channel regions CH1 may be interposed between a pair of the first source/drain regions SD1. Second channel regions CH2 and second source/drain regions SD2 may be provided at the upper portions of the second active patterns AP2. The second source/drain regions SD2 may be n-type impurity regions. Each of the second channel regions CH2 may be interposed between a pair of the second source/drain regions SD2.

The first and second source/drain regions SD1 and SD2 may be epitaxial patterns formed by a selective epitaxial growth process. The first and second source/drain regions SD1 and SD2 may have top surfaces positioned higher than those of the first and second channel regions CH1 and CH2. The first and second source/drain regions SD1 and SD2 may include a semiconductor element different from that of the substrate 100. For example, the first source/drain regions SD1 may include a semiconductor element whose lattice constant is greater than that of a semiconductor element included in the substrate 100. As a result, the first source/drain regions SD1 may provide the first channel regions CH1 with a longitudinal compressive stress. For example, the second source/drain regions SD2 may include a semiconductor element whose lattice constant is equal to or smaller than that of a semiconductor element included in the substrate 100. As a result, the second source/drain regions SD2 may provide the second channel regions CH2 with a longitudinal tensile stress.

Gate electrodes GE may be provided to extend in the first direction D1 while running across the first and second active patterns AP1 and AP2. The gate electrodes GE may be spaced apart from each other in the second direction D2. The gate electrodes GE may vertically overlap with the first and second channel regions CH1 and CH2. Each of the gate electrodes GE may surround the top surface and opposite sidewalls of each of the first and second channel regions CH1 and CH2 (see FIG. 2D). For example, the gate electrodes GE may include at least one of conductive metal nitride (e.g., titanium nitride or tantalum nitride) and metal (e.g., titanium, tantalum, tungsten, copper, or aluminum).

The gate electrodes GE may include a first gate electrode GE1 and a second gate electrode GE2. The first gate electrode GE1 may run across the first active patterns AP1 of the PMOSFET region PR, and the second gate electrode GE2 may run across the second active patterns AP2 of the NMOSFET region NR. The first and second gate electrodes GE1 and GE2 may be aligned side by side in the first direction D1.

A pair of gate spacers GS may be disposed on opposite sidewalls of each of the gate electrodes GE. The gate spacers GS may extend in the first direction D1 along the gate electrodes GE. The gate spacers GS may have top surfaces higher than those of the gate electrodes GE. The top surfaces of the gate spacers GS may be coplanar with that of a first interlayer dielectric layer 140 which is discussed below. The gate spacers GS may include at least one of SiO2, SiCN, SiCON, and SiN. Alternatively, the gate spacers GS may be a multiple layer of two or more of SiO2, SiCN, SiCON, and SiN.

The pair of gate spacers GS may include a first gate spacer GS1 and a second gate spacer GS2. The first and second gate electrodes GE1 and GE2 may be interposed between the first and second gate spacers GS1 and GS2. The first gate spacer GS1 may be positioned on a sidewall of each of the first and second gate electrodes GE1 and GE2. The second gate spacer GS2 may be positioned on an opposite sidewall of each of the first and second gate electrodes GE1 and GE2.

Gate dielectric patterns GI may be interposed between the gate electrodes GE and the first active patterns AP1 and between the gate electrodes GE and the second active patterns AP2. Each of the gate dielectric patterns GI may extend along a bottom surface of each of the gate electrodes GE. Each of the gate dielectric patterns GI may cover the top surface and the opposite sidewalls of each of the first and second channel regions CH1 and CH2. The gate dielectric patterns GI may include a high-k dielectric material. For example, the high-k dielectric material may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate dielectric patterns GI may include a first gate dielectric pattern GI1 and a second gate dielectric pattern GI2. The first gate dielectric pattern GI1 may be interposed between the first gate electrode GE1 and the first active patterns AP1. The second gate dielectric pattern GI2 may be interposed between the second gate electrode GE2 and the second active patterns AP2.

A gate capping pattern GP may be provided on each of the gate electrodes GE. The gate capping pattern GP may extend in the first direction D1 along the gate electrode GE. The gate capping pattern GP may be interposed between a pair of the gate spacers GS. The gate capping patterns GP may include a material having an etch selectivity to first and second interlayer dielectric layers 140 and 150 which will be discussed below. In detail, the gate capping patterns GP may include at least one of SiON, SiCN, SiCON, and SiN.

An insulation pattern IP may be interposed between the first and second gate electrodes GE1 and GE2. The insulation pattern IP may be provided on the device isolation layer ST between the PMOSFET and NMOSFET regions PR and NR. The insulation pattern IP may vertically overlap with the device isolation layer ST between the PMOSFET and NMOSFET regions PR and NR. The insulation pattern IP may have a round upper portion. The round upper portion of the insulation pattern IP may have a width in the first direction D1 that decreases with increasing vertical distance from the substrate 100. The insulation pattern IP may physically and electrically insulate the first and second gate electrodes GE1 and GE2 from each other. For example, the insulation pattern IP may include silicon nitride or silicon oxynitride.

The second gate electrode GE2, the insulation pattern IP, and the first gate electrode GE1 may be arranged in the first direction D1. In other words, the second gate electrode GE2, the insulation pattern IP, and the first gate electrode GE1 may be aligned with each other in the first direction D1 (see FIGS. 1 and 3). The insulation pattern IP may be interposed between the first and second gate spacers GS1 and GS2. The first and second gate electrodes GE1 and GE2 may have top surfaces lower than an uppermost top surface of the insulation pattern IP.

For example, the first gate electrode GE1 may include a first part P1 and a second part P2. The first part P1 may run across the first active patterns AP1 and extend in the first direction D1. The second part P2 may be interposed between the first part P1 and the insulation pattern IP. The second part P2 may have a first recessed top portion RS1. The second part P2 may have a top surface whose height is less than that of a top surface of the first part P1. The height of the top surface of the second part P2 may decrease with approaching the insulation pattern IP from the first part P1. The first recessed top portion RS1 of the second part P2 may have a concave shape.

Likewise the first gate electrode GE1, the second gate electrode GE2 may also have a second recessed top portion RS2 adjacent to the insulation pattern IP. The gate capping pattern GP may cover the first and second recessed top portions RS1 and RS2.

The first gate dielectric pattern GI1 may vertically extend between the first gate electrode GE1 and the insulation pattern IP. The second gate dielectric pattern GI2 may vertically extend between the second gate electrode GE2 and the insulation pattern IP.

A first interlayer dielectric layer 140 may be provided on the substrate 100. The first interlayer dielectric layer 140 may cover the gate spacers GS, the first source/drains SD1, and the second source/drain regions SD2. The first interlayer dielectric layer 140 may have a top surface substantially coplanar with top surfaces of the gate capping patterns GP and the top surfaces of the gate spacers GS. The first interlayer dielectric layer 140 may be provided thereon with a second interlayer dielectric layer 150 covering the gate capping patterns GP.

In addition, a pair of the gate electrodes GE may be provided therebetween with at least one of active contacts AC that penetrate the first and second interlayer dielectric layers 140 and 150 and are electrically connected to the first and second source/drain regions SD1 and SD2. For example, each of the active contacts AC may be connected to either a plurality of the first source/drain regions SD1 or a plurality of the second source/drain regions SD2. Alternatively, in some embodiments according to the inventive concept, at least one active contact AC may be connected to a single first or second source/drain region SD1 or SD2, but the present inventive concept is not limited thereto.

At least one active contact AC may extend toward the substrate 100 while covering a portion of the gate capping pattern GP and an upper portion of the gate spacer GS. At least one active contact AC may have a width in the second direction D2, and the width may be substantially the same as a distance between the gate spacers GS that are adjacent to each other across one of the first and second source/drain regions SD1 and SD2. In other words, at least one active contact AC may be a contact formed in a self-aligned manner.

Each of the active contacts AC may include a conductive pillar 165 and a barrier layer 160 surrounding the conductive pillar 165. The barrier layer 160 may cover sidewalls and a bottom surface of the conductive pillar 165. The conductive pillar 165 may include a metallic material, for example, at least one of aluminum, copper, tungsten, molybdenum or cobalt. The barrier layer 160 may include metal layer/metal nitride layer, for example, at least one of Ti/TiN, Ta/TaN, W/WN, Ni/NiN, Co/CoN or Pt/PtN.

In some embodiments according to the inventive concept, silicide layers may be interposed between the active contacts AC and the first source/drain regions SD1 and between the active contacts AC and the second source/drain regions SD2. That is, the active contacts AC may be electrically connected through the silicide layers to the first and second source/drain regions SD1 and SD2. The silicide layers may include metal silicide, for example, at least one of titanium silicide, tantalum silicide, and tungsten silicide, nickel silicide or cobalt silicide.

As the second part P2 of the first gate electrode GE1 has the first recessed top portion RS1, a relatively great vertical distance may be provided between the first recessed top portion RS1 and the active contact AC adjacent to the insulation pattern IP. For example, a vertical distance may be greater between the active contact AC and the first recessed top portion RS1 than between the active contact AC and the top surface of the first portion of the gate electrode GE (see FIG. 2B).

Figure 4A:
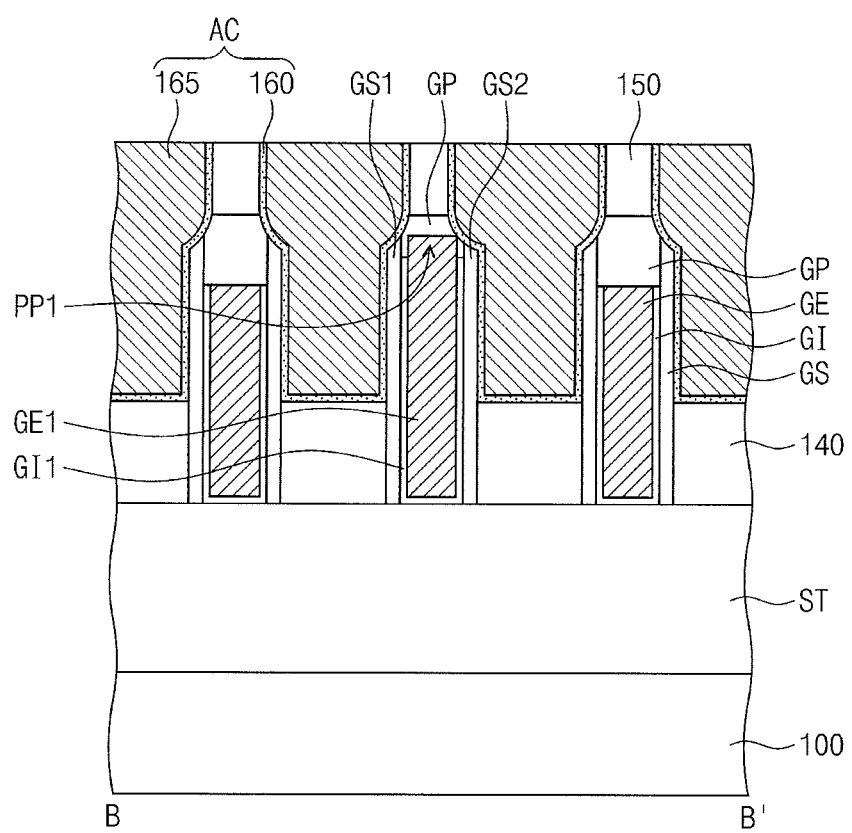
FIGS. 4A and 4B are cross-sectional representations of a conventional device showing structures that correspond to those taken along lines B-B' and D-D' of FIG. 1, for comparative purposes.
Figure 4B:
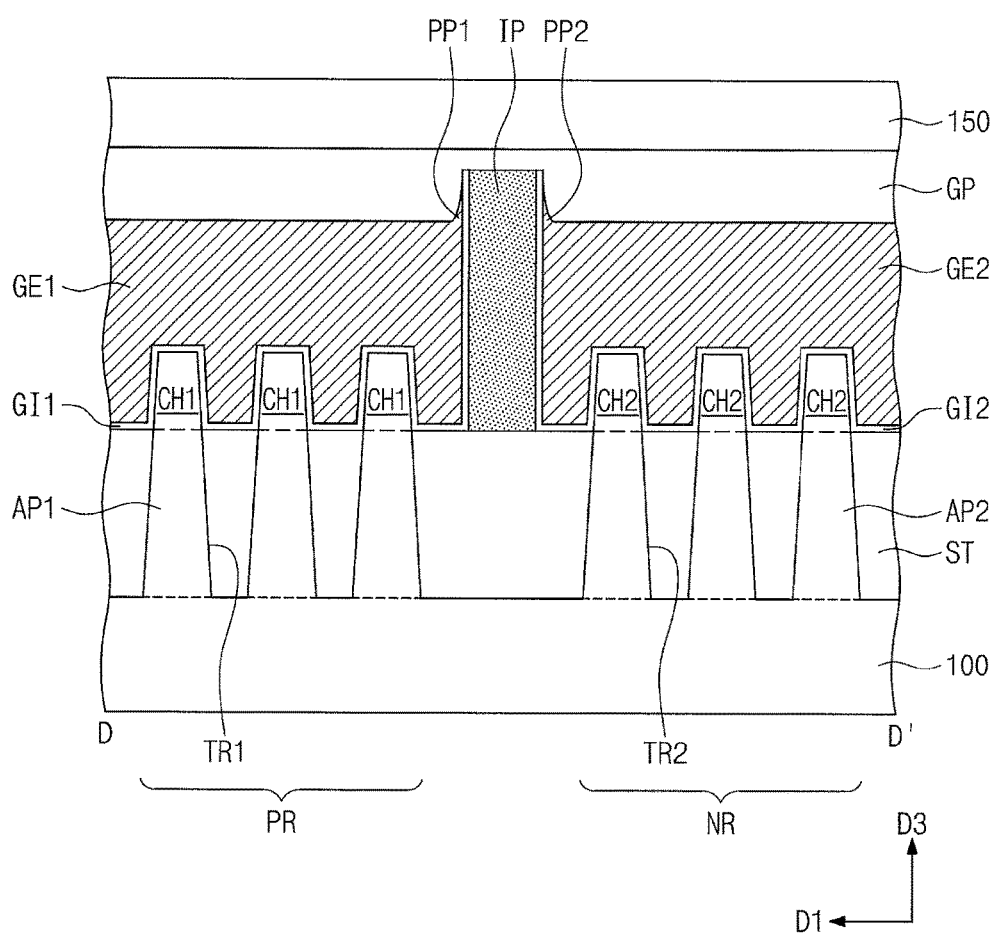
Figure 5:
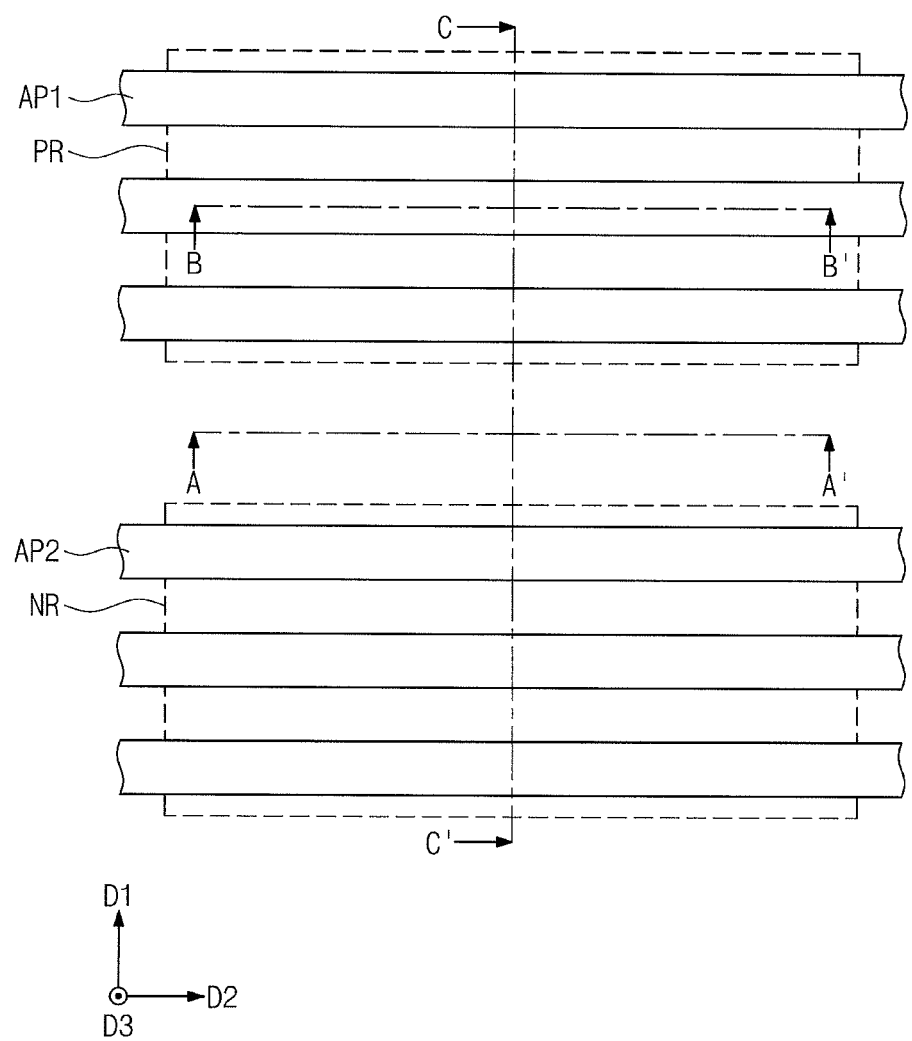
FIGS. 5, 7, 9, 11, 13, and 15 are plan views illustrating a method of manufacturing a semiconductor device according to exemplary embodiments of the present inventive concept.
Figure 6A:
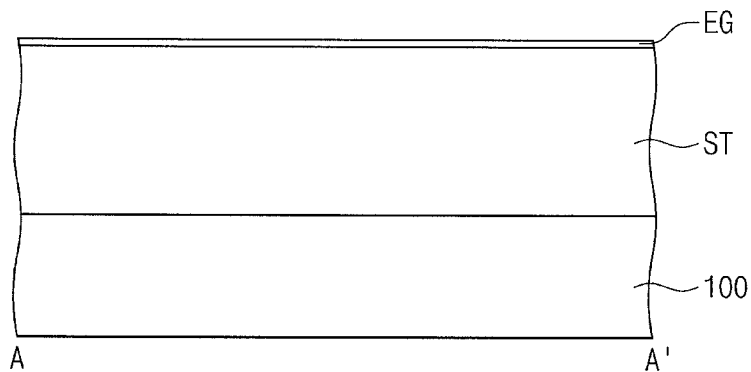
FIGS. 6A, 8A, 10A, 12A, 14A, and 16A are cross-sectional views taken along line A-A' of FIGS. 5, 7, 9, 11, 13, and 15, respectively.
Figure 6A:
Figure 6B:
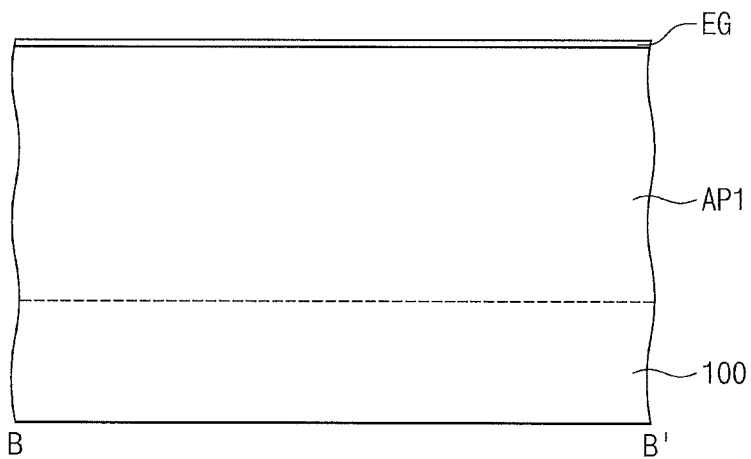
FIGS. 6B, 8B, 10B, 12B, 14B, and 16B are cross-sectional views taken along line B-B' of FIGS. 5, 7, 9, 11, 13, and 15, respectively.
Figure 6B:
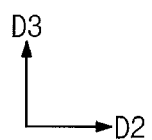
Figure 6C:
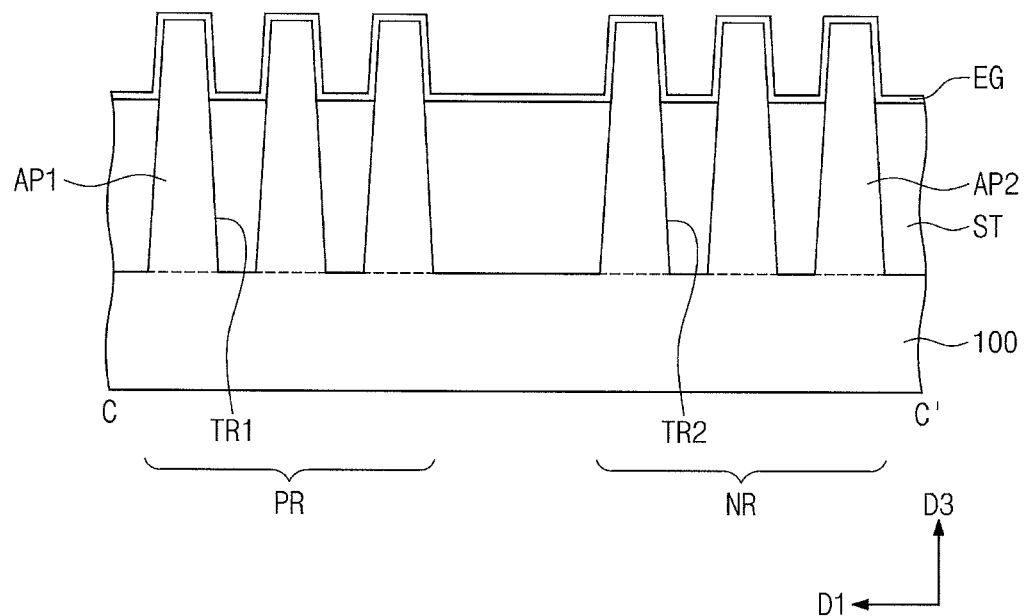
FIGS. 6C, 8C, 10C, 12C, 14C, and 16C are cross-sectional views taken along line C-C' of FIGS. 5, 7, 9, 11, 13, and 15, respectively.
Figure 7:
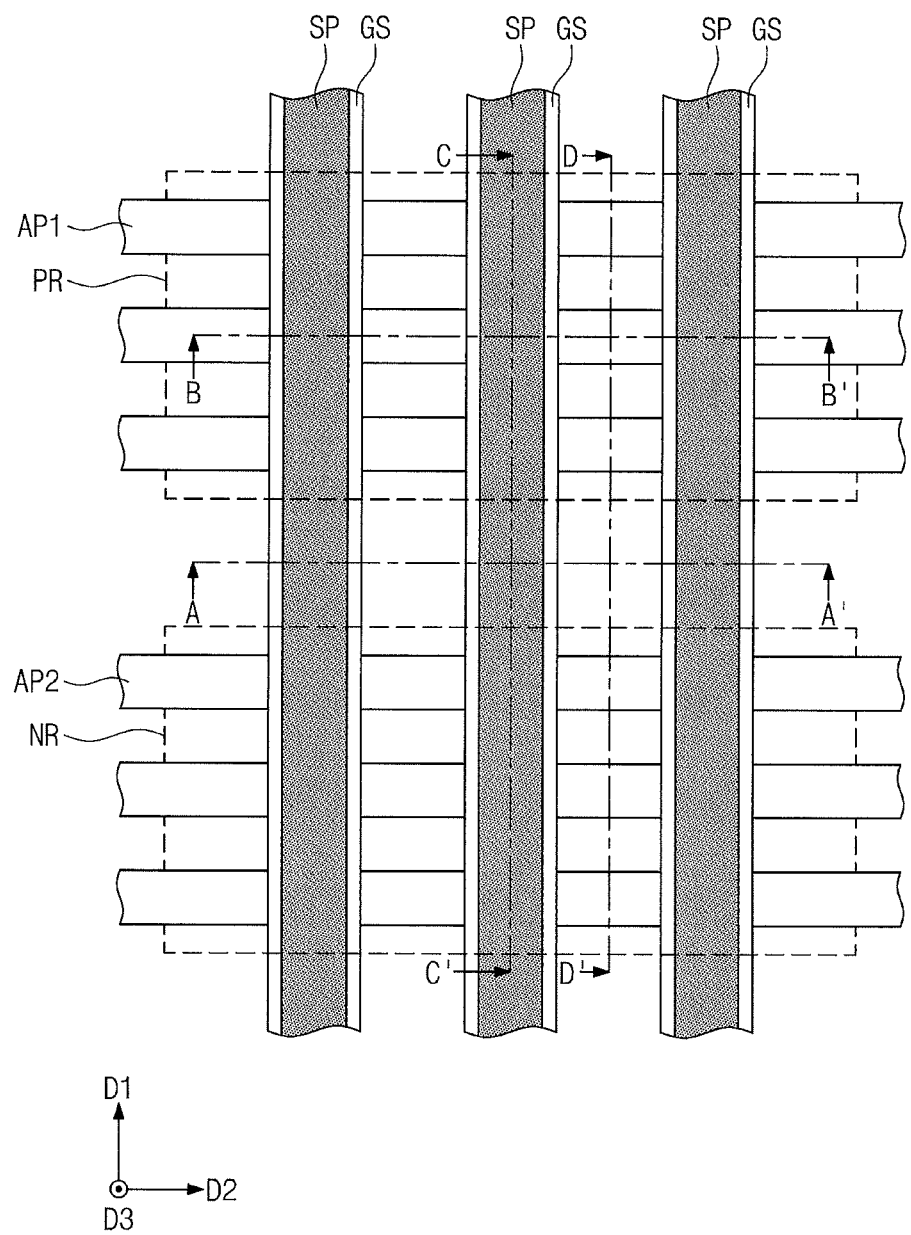
Figure 8A:
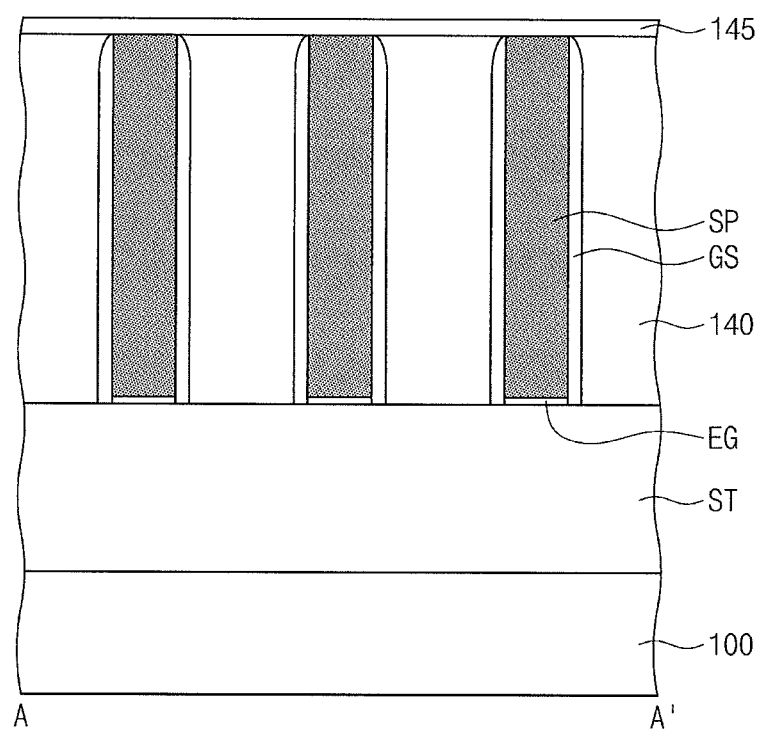
Figure 8B:
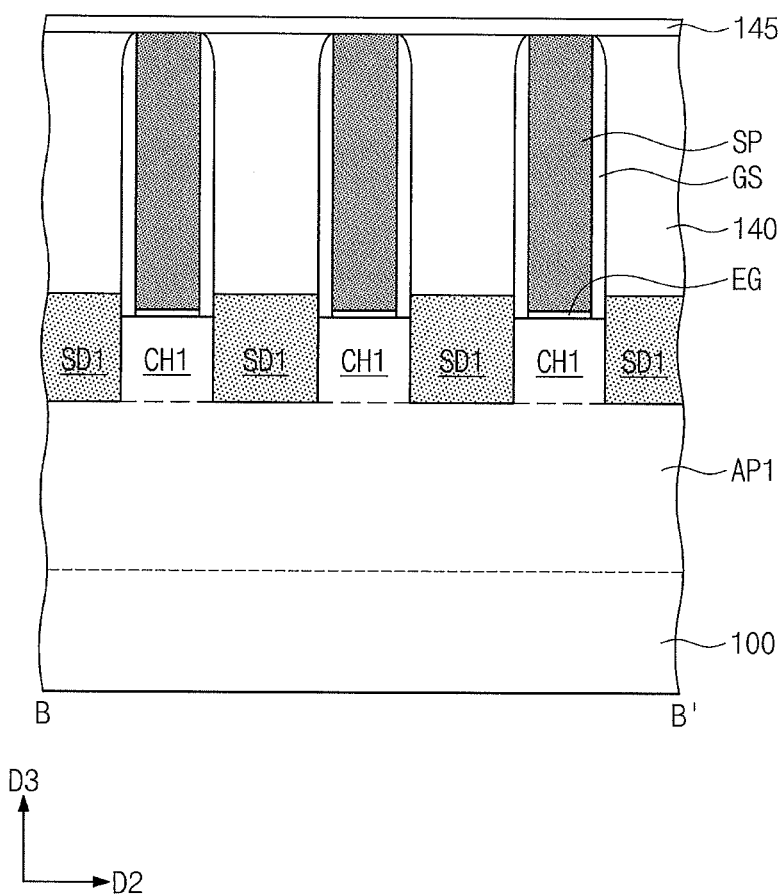
Figure 8C:
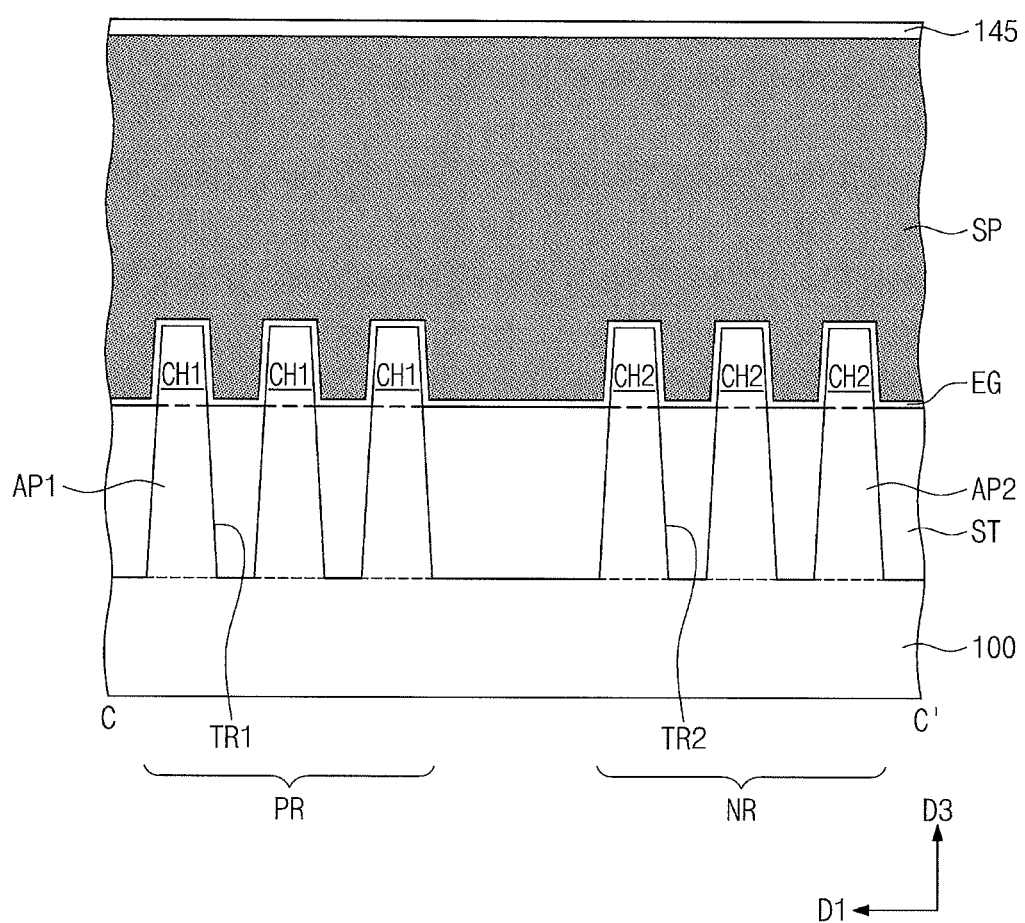
Figure 8D:
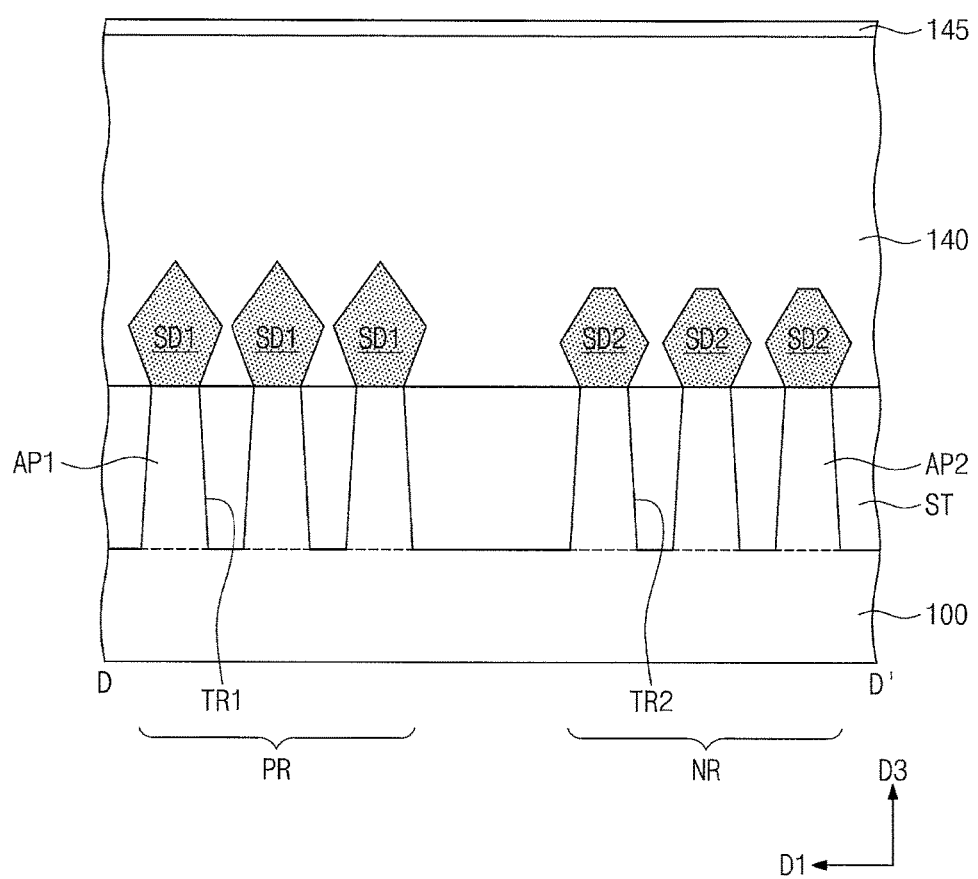
FIGS. 8D, 10D, 12D, 14D, and 16D are cross-sectional views taken along line D-D' of FIGS. 7, 9, 11, 13, and 15, respectively.
Figure 9:
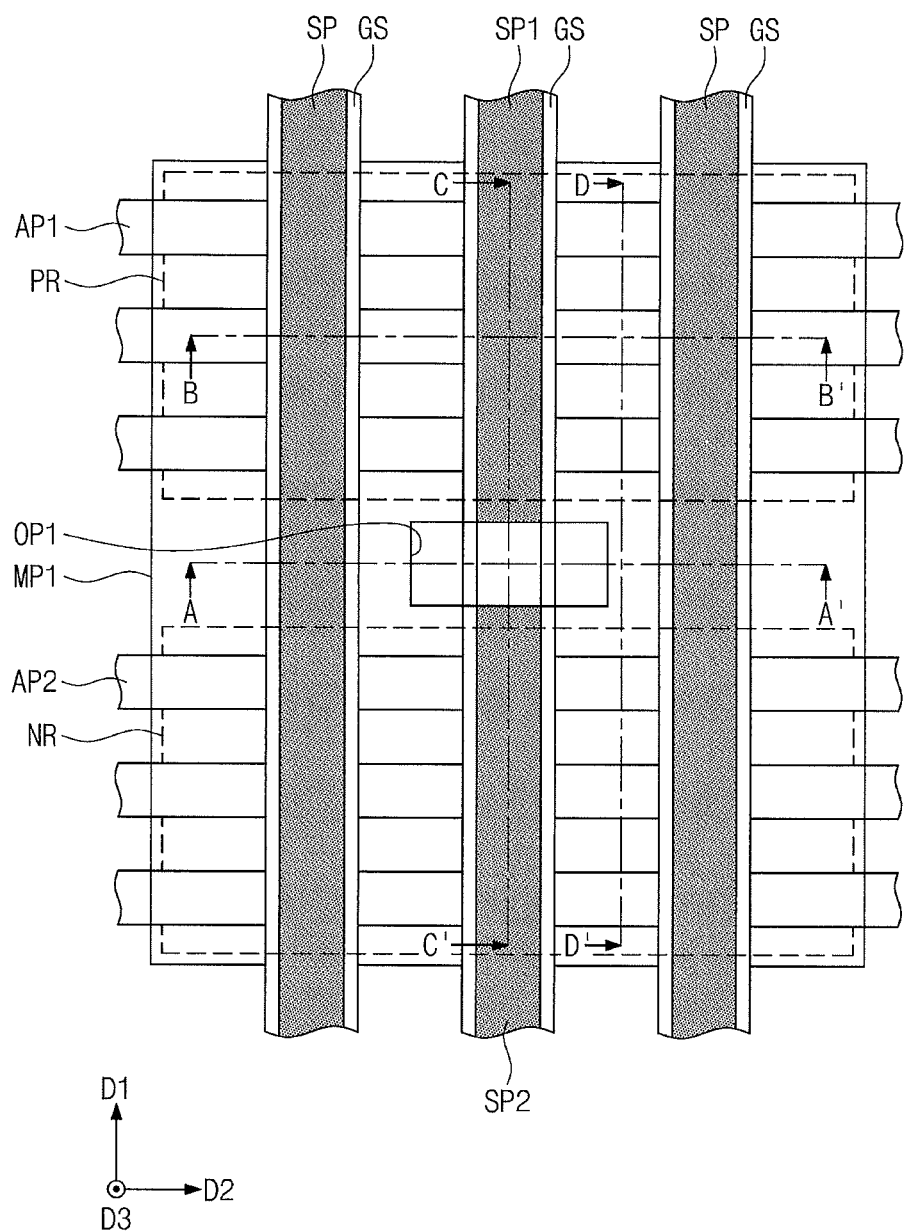
Figure 10A:
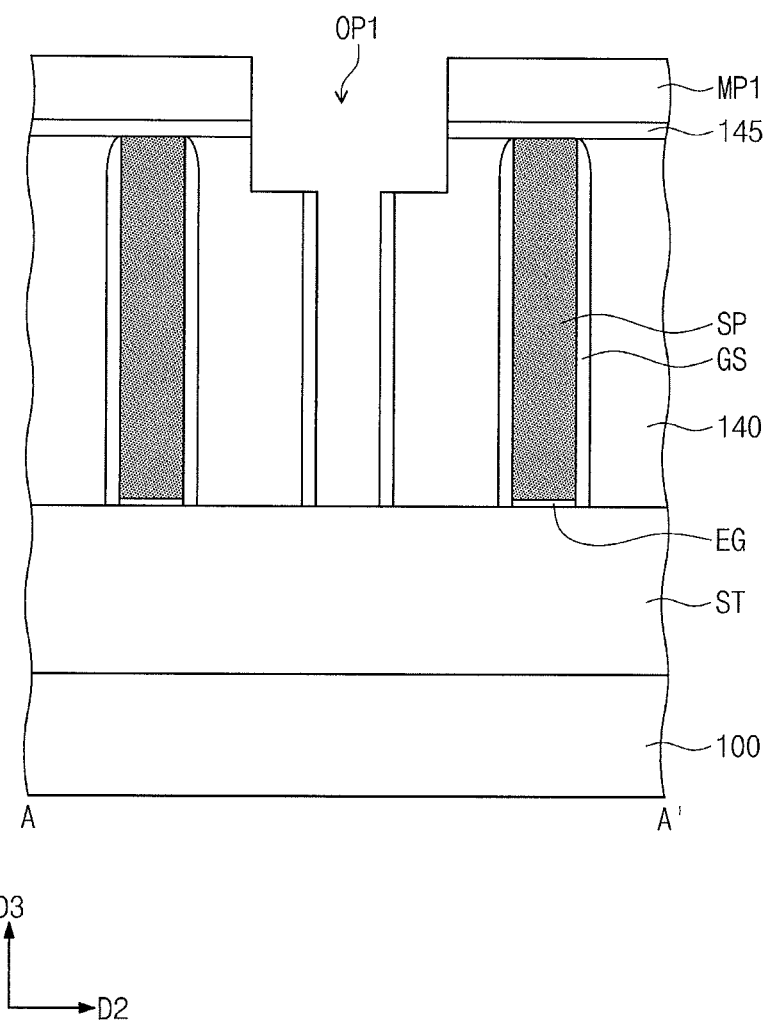
Figure 10B:
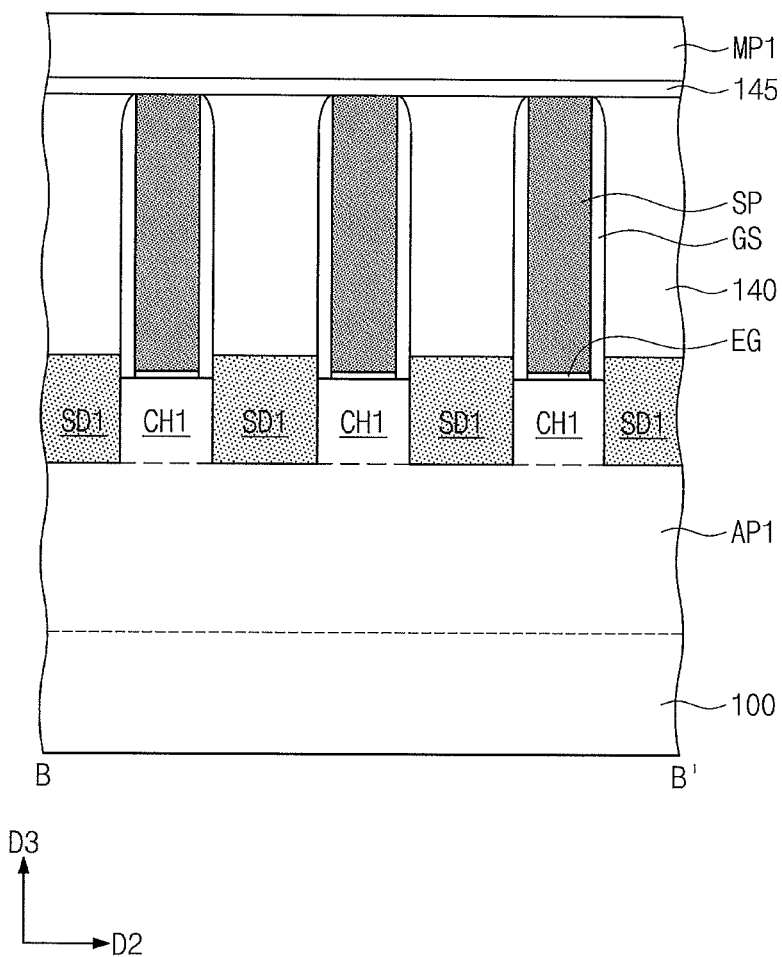
Figure 10C:
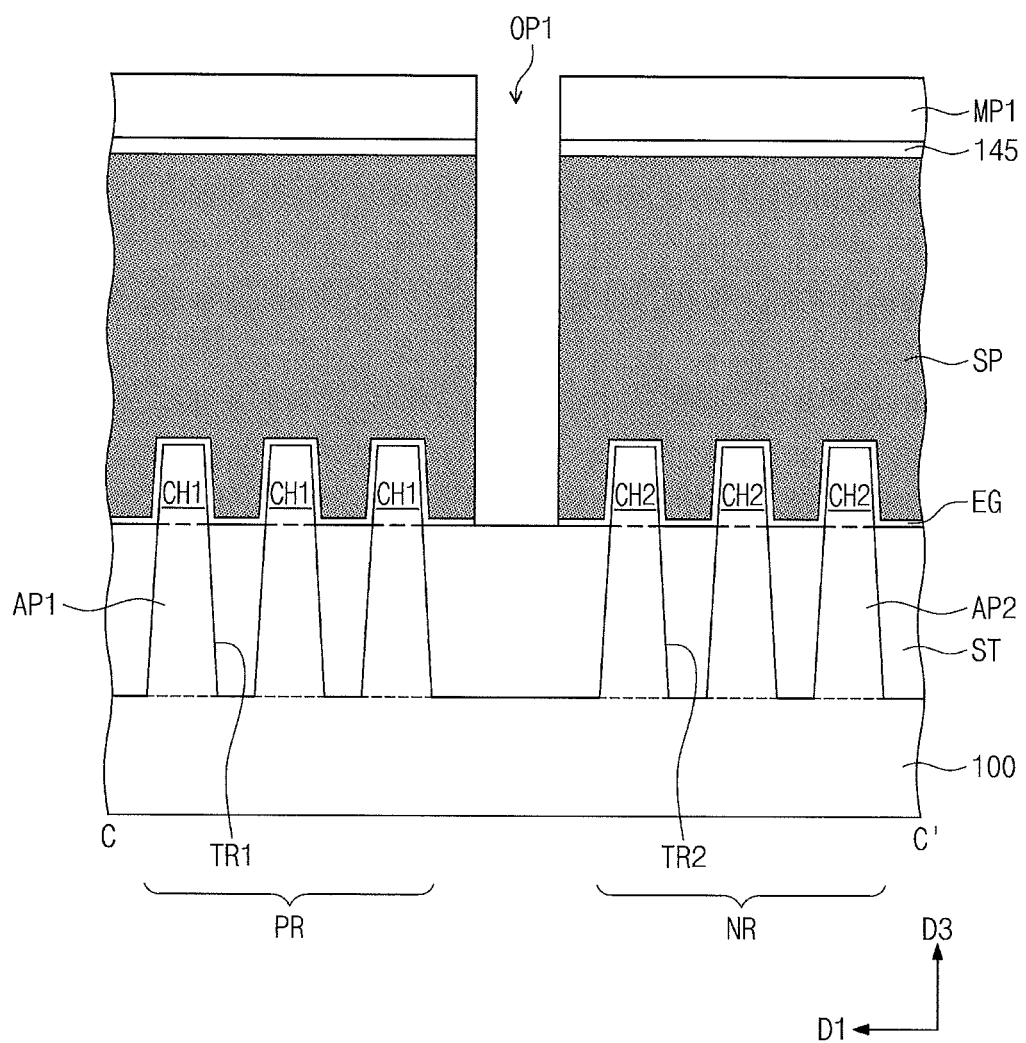
Figure 10D:
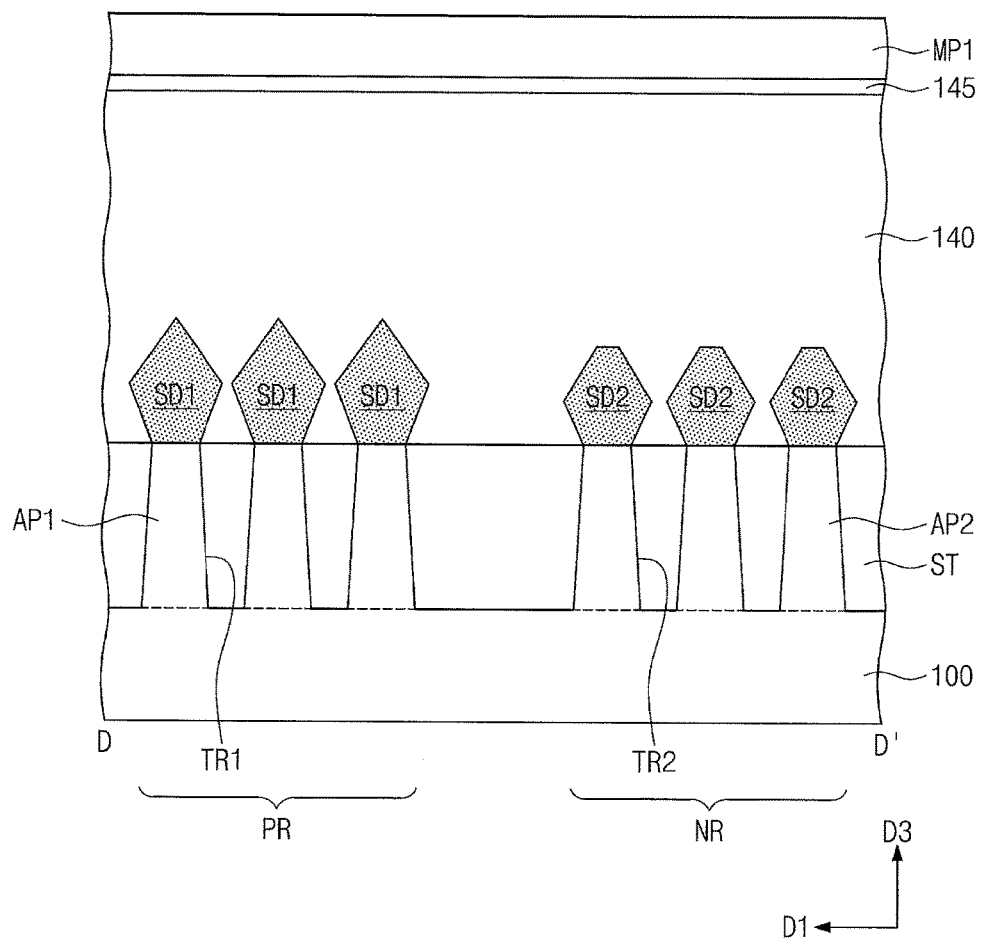
Figure 11:
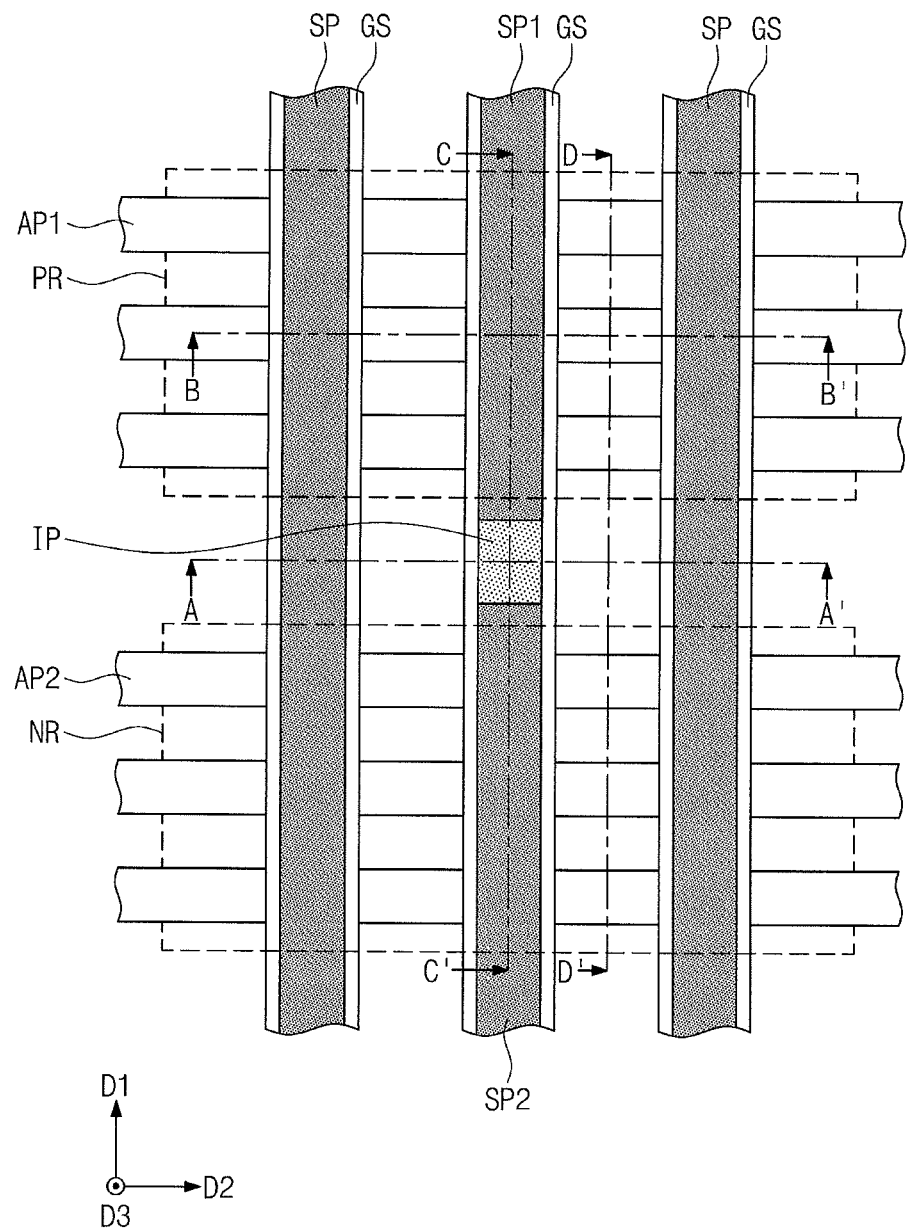
Figure 12A:
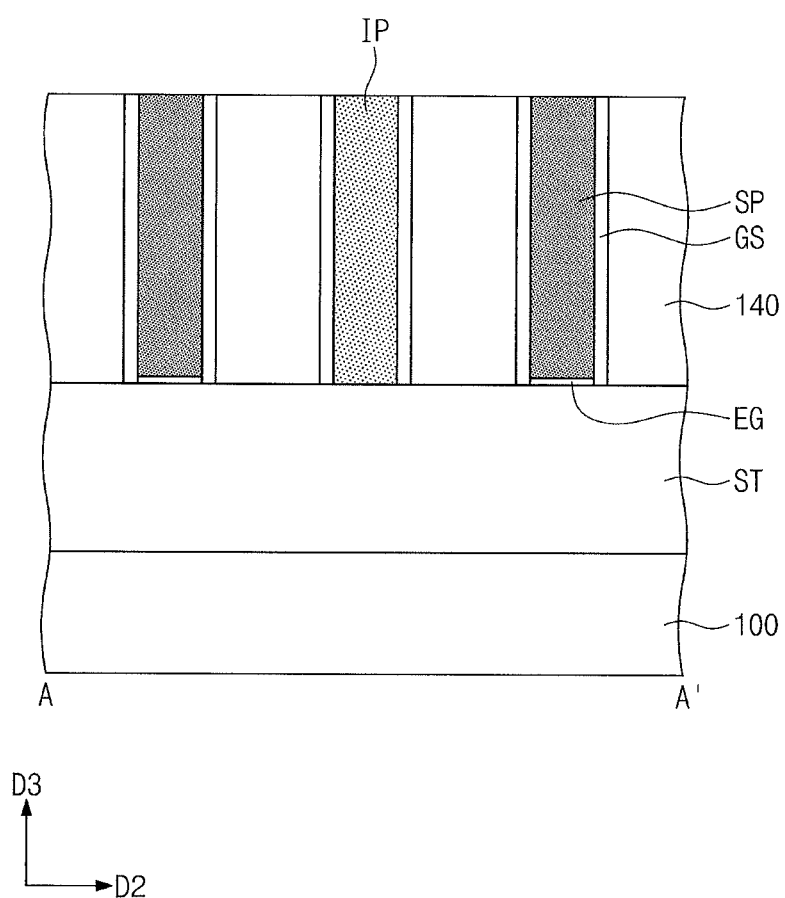
Figure 12B:
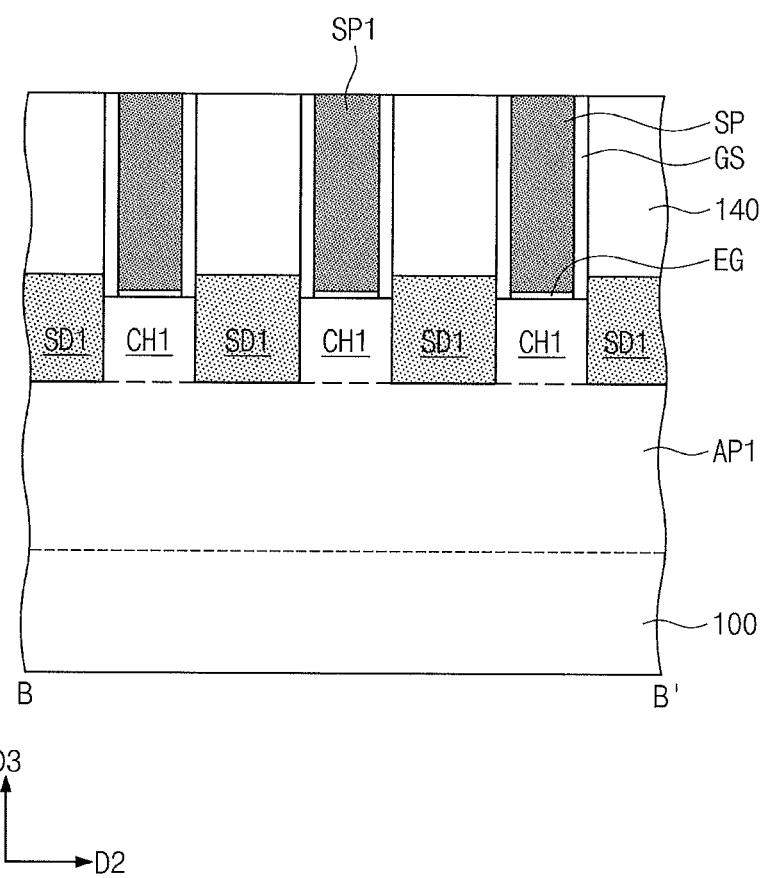
Figure 12C:
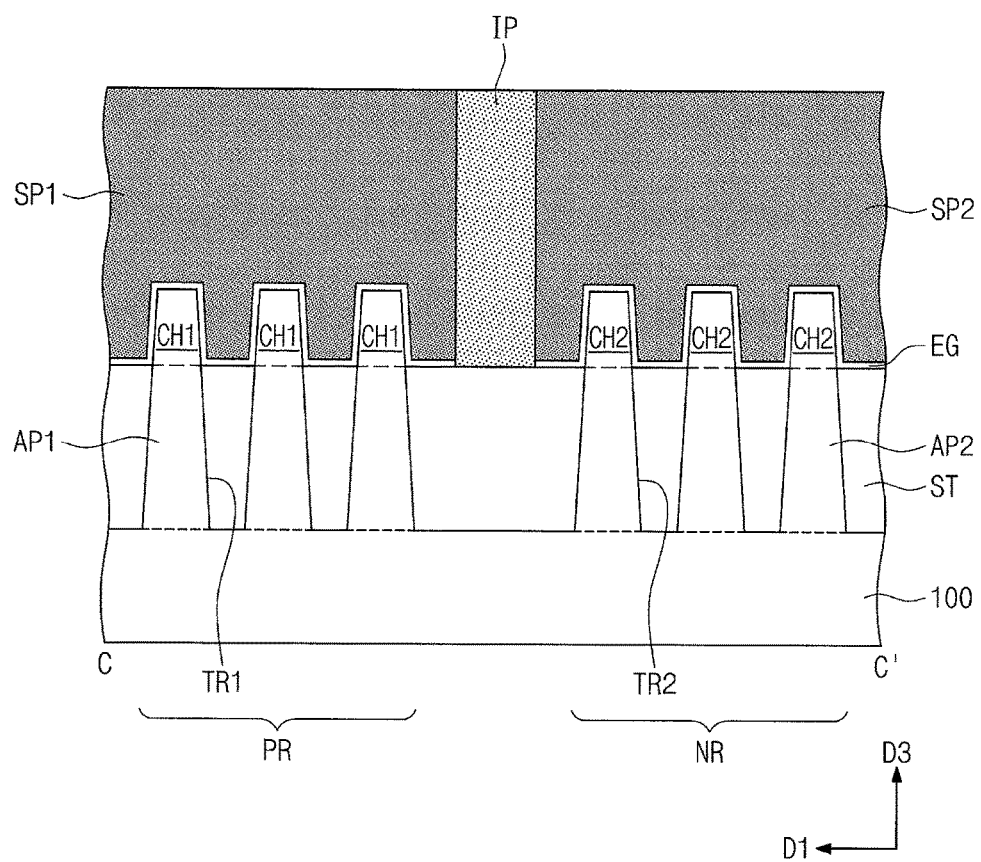
Figure 12D:
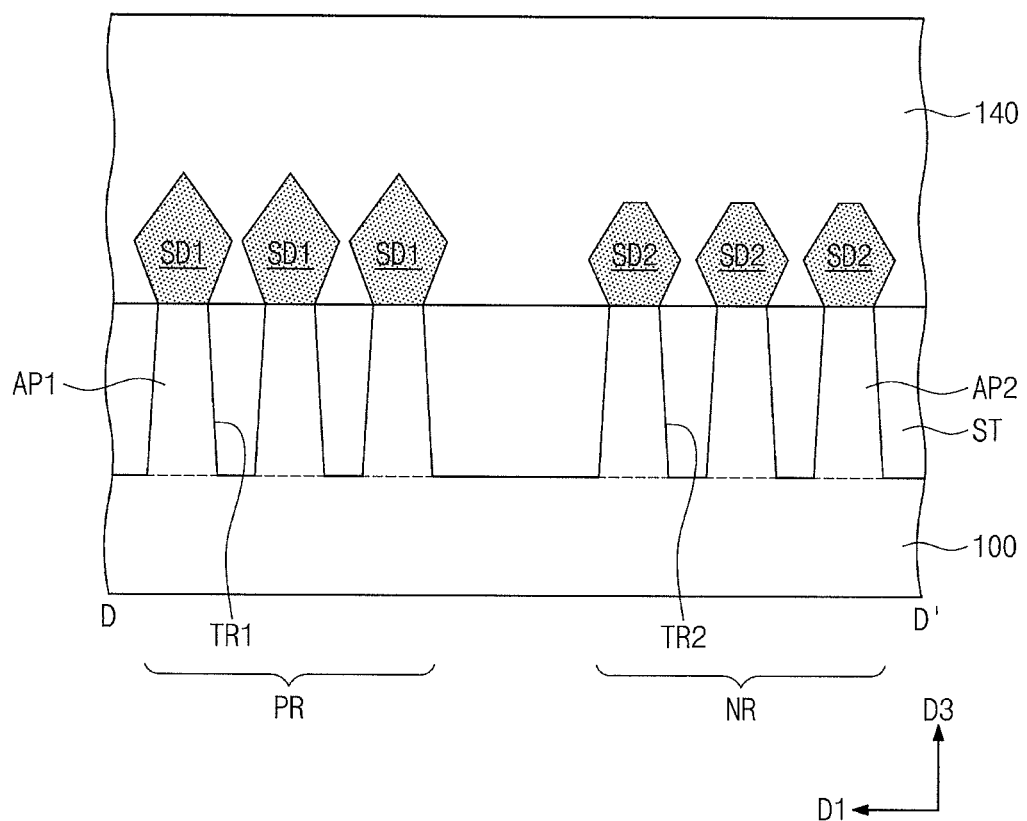
Figure 13:
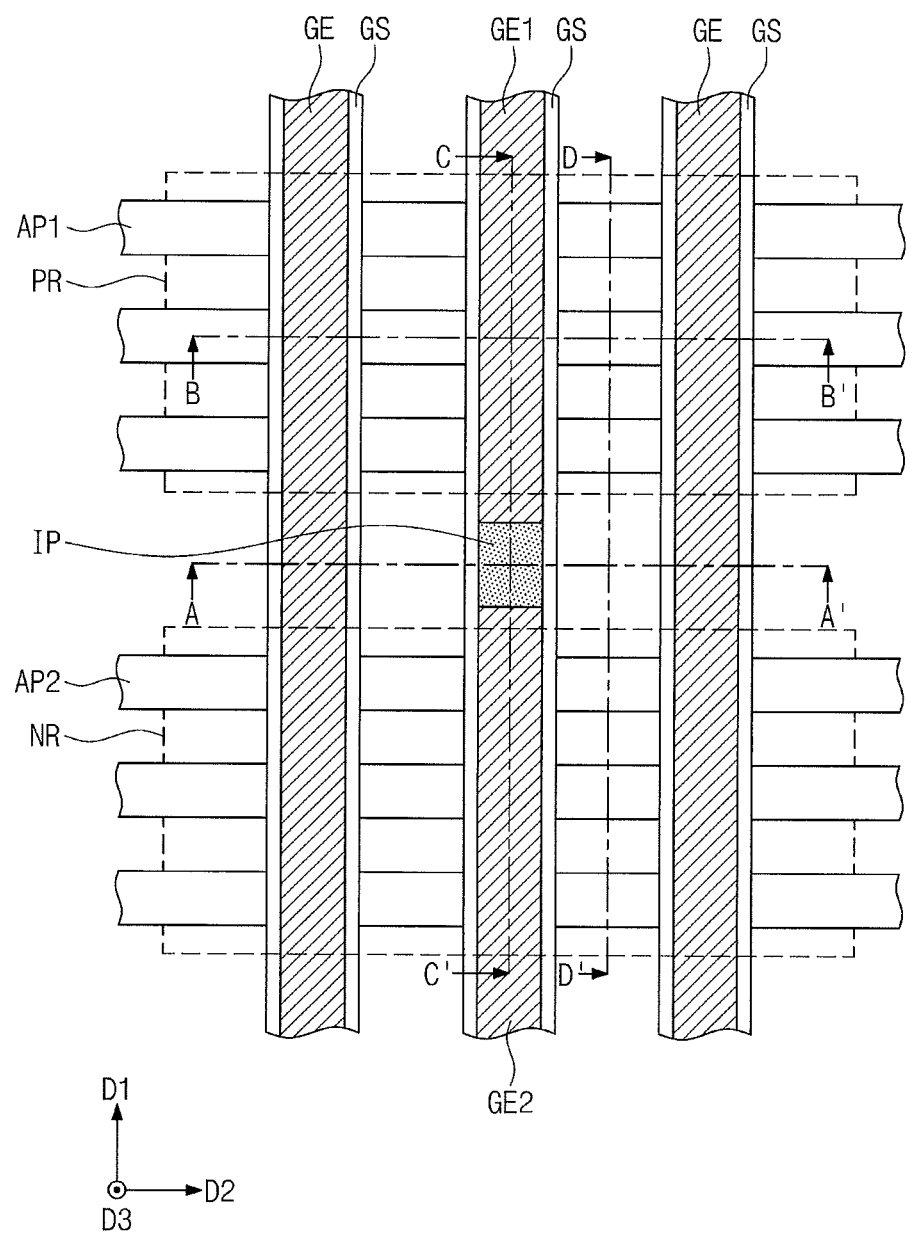
Figure 14A:
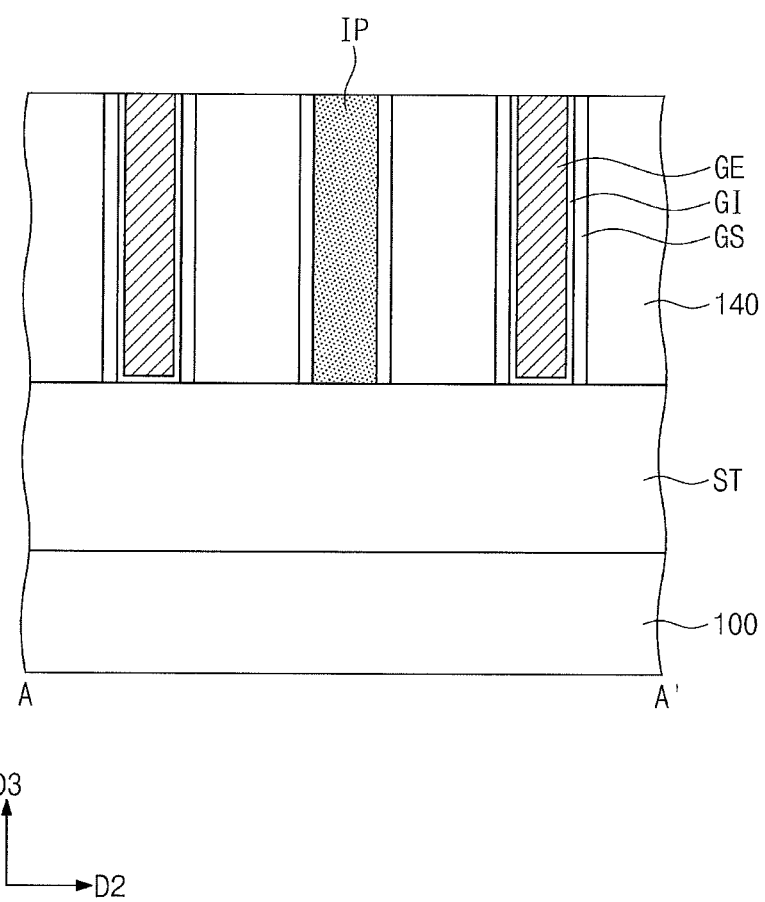
Figure 14B:
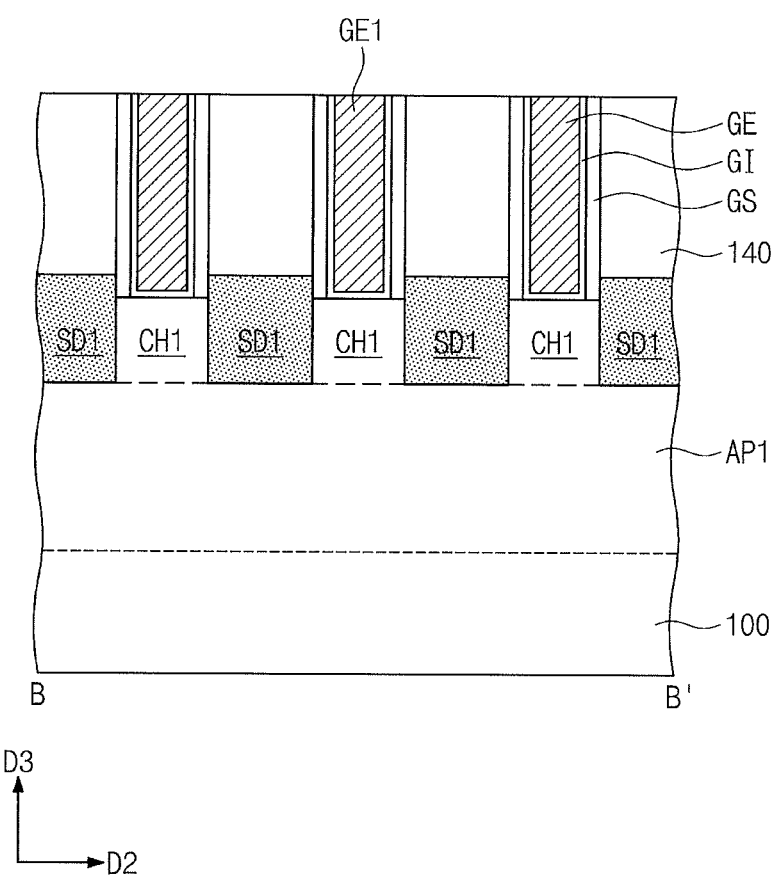
Figure 14C:
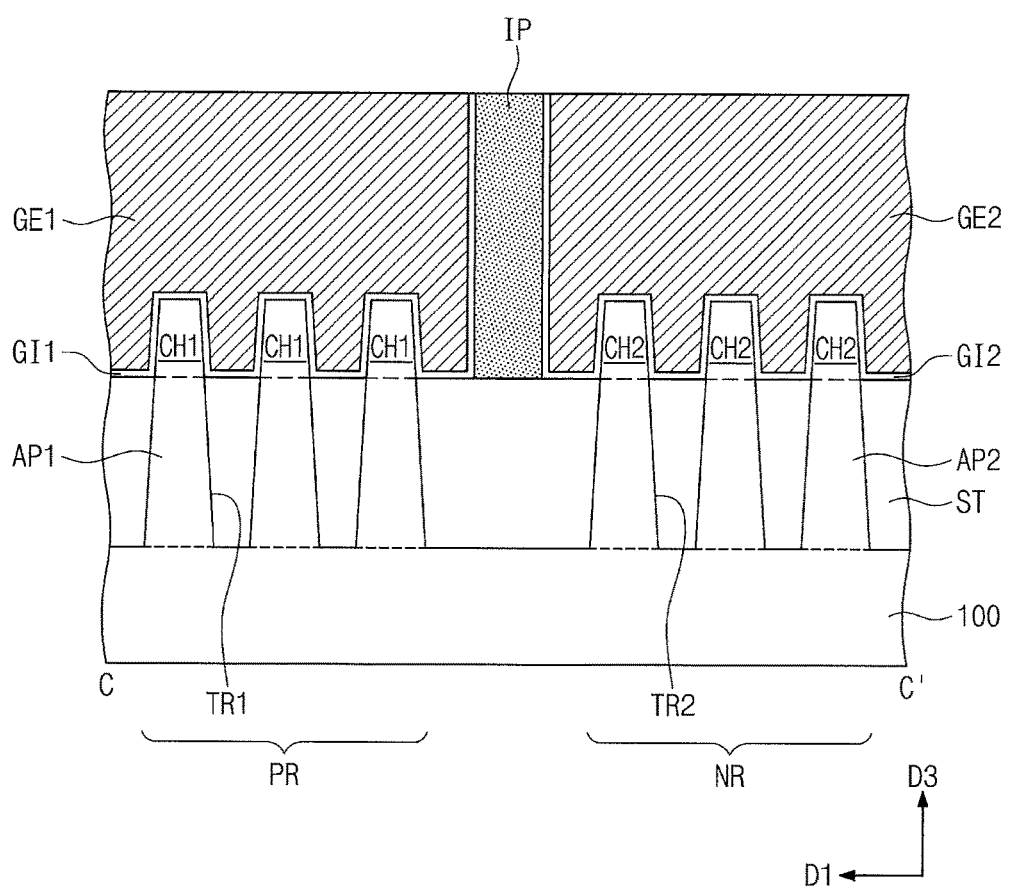
Figure 14D:
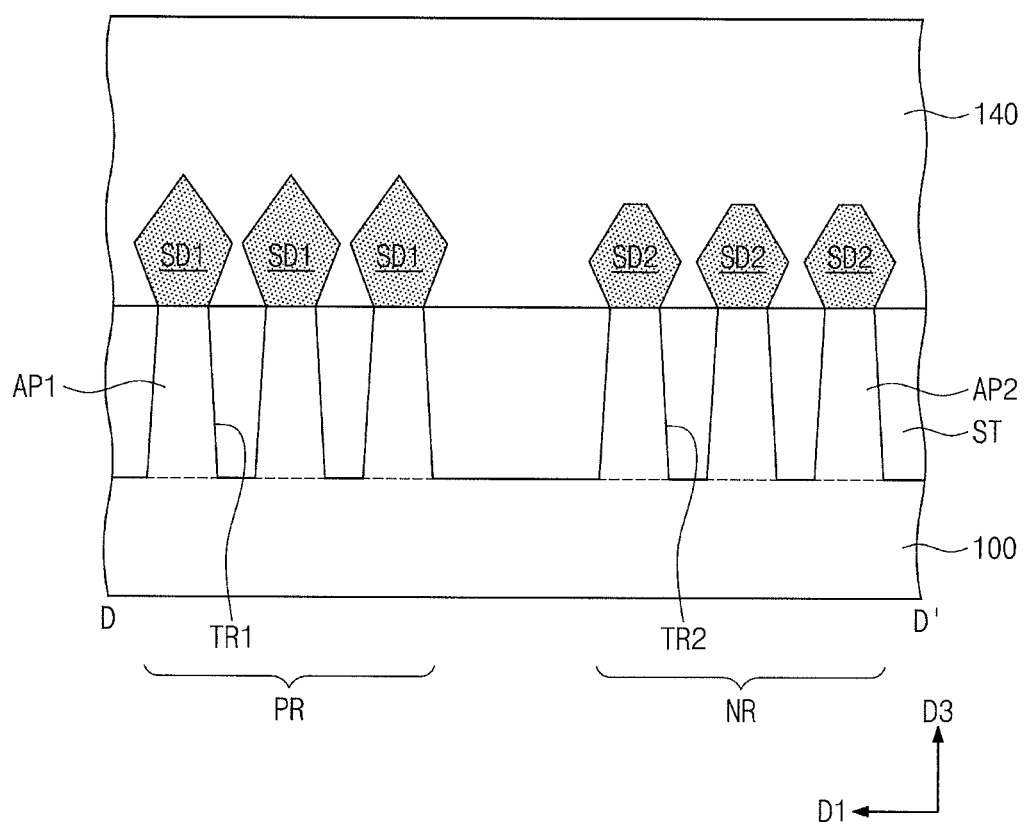
Figure 15:
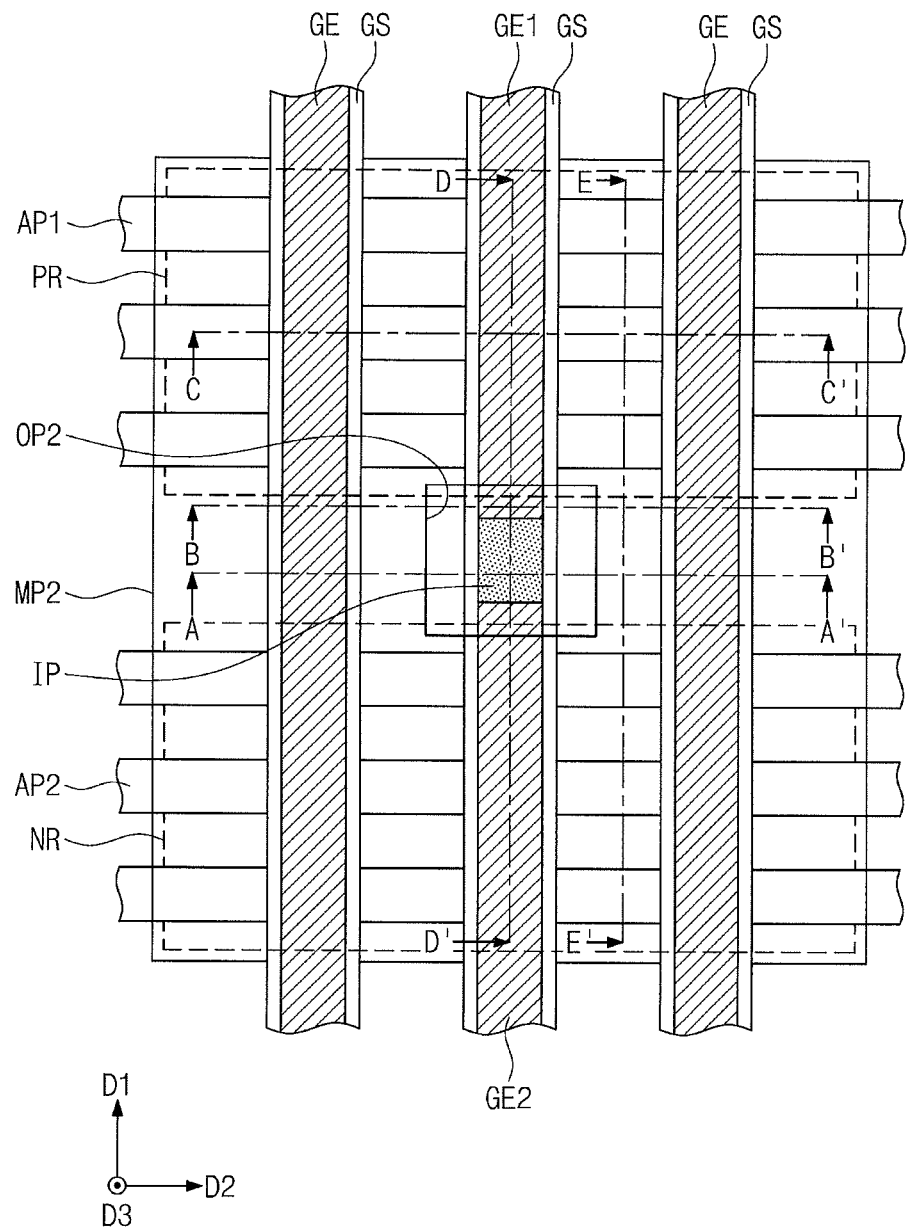

FIGS. 4A and 4B are cross-sectional representations of a conventional device corresponding to the views taken along lines B-B' and D-D' of FIG. 1, respectively for comparative purposes. Referring to FIGS. 1, 4A, and 4B, first and second protrusions PP1 and PP2 may be respectively included in first and second gate electrodes GE1 and GE2 of a semiconductor device according to a comparative example of the present inventive concept. The first and second protrusions PP1 and PP2 may be adjacent to an insulation pattern IP. The first and second protrusions PP1 and PP2 may extend in a perpendicular direction (or a third direction D3) along the insulation pattern IP. The first and second protrusions PP1 and PP2 may have top surfaces higher than those of the first and second gate electrodes GE1 and GE2. In this configuration, an electrical short may occur between the first protrusion PP1 and an active contact AC adjacent to the insulation pattern IP (see FIG. 4A).

Figure 2A:
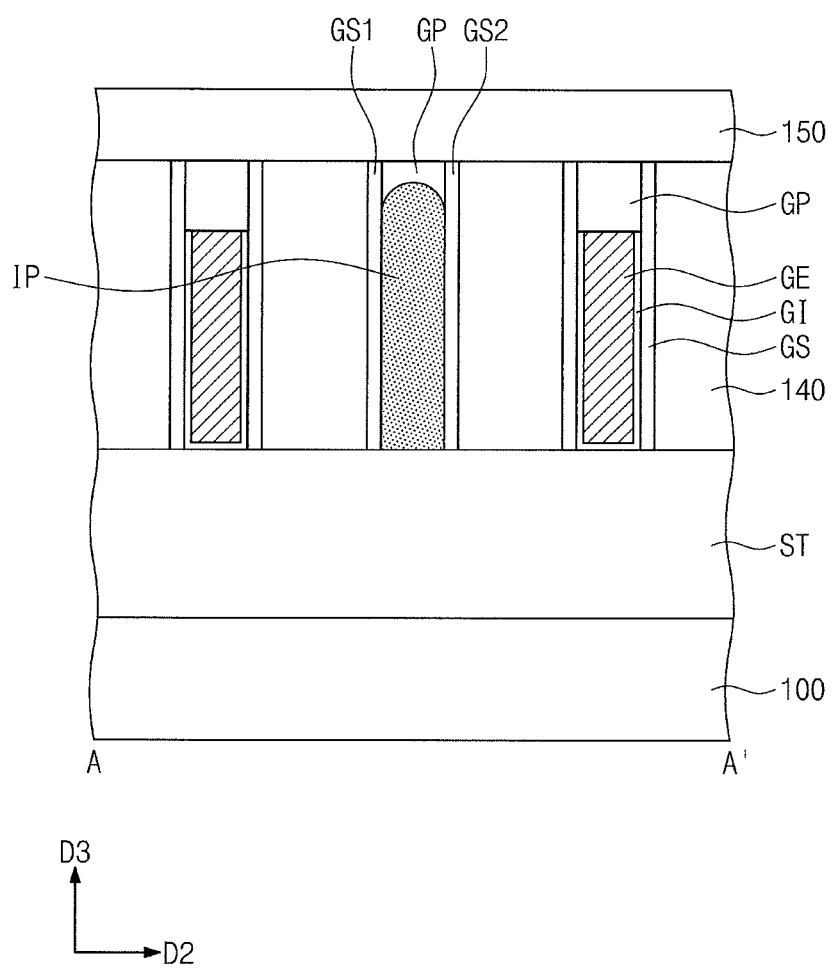
FIGS. 2A to 2E are cross-sectional views respectively taken along lines A-A', B-B', C-C', D-D', and E-E' of FIG. 1.
Figure 2B:
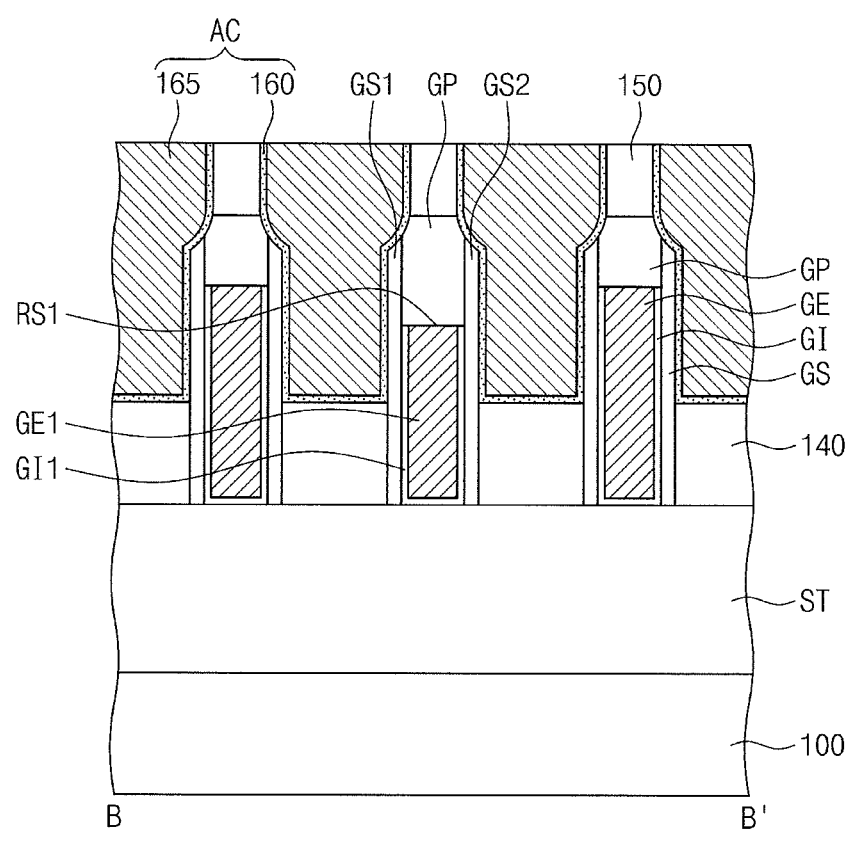
Figure 2C:
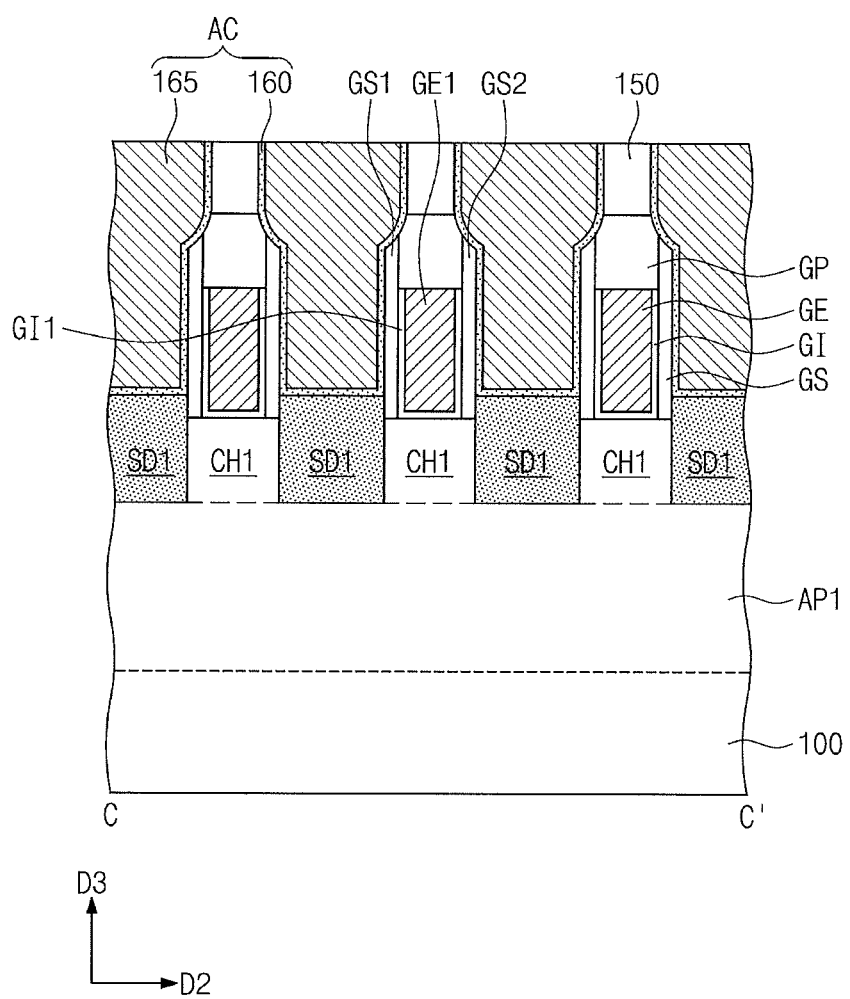
Figure 2D:
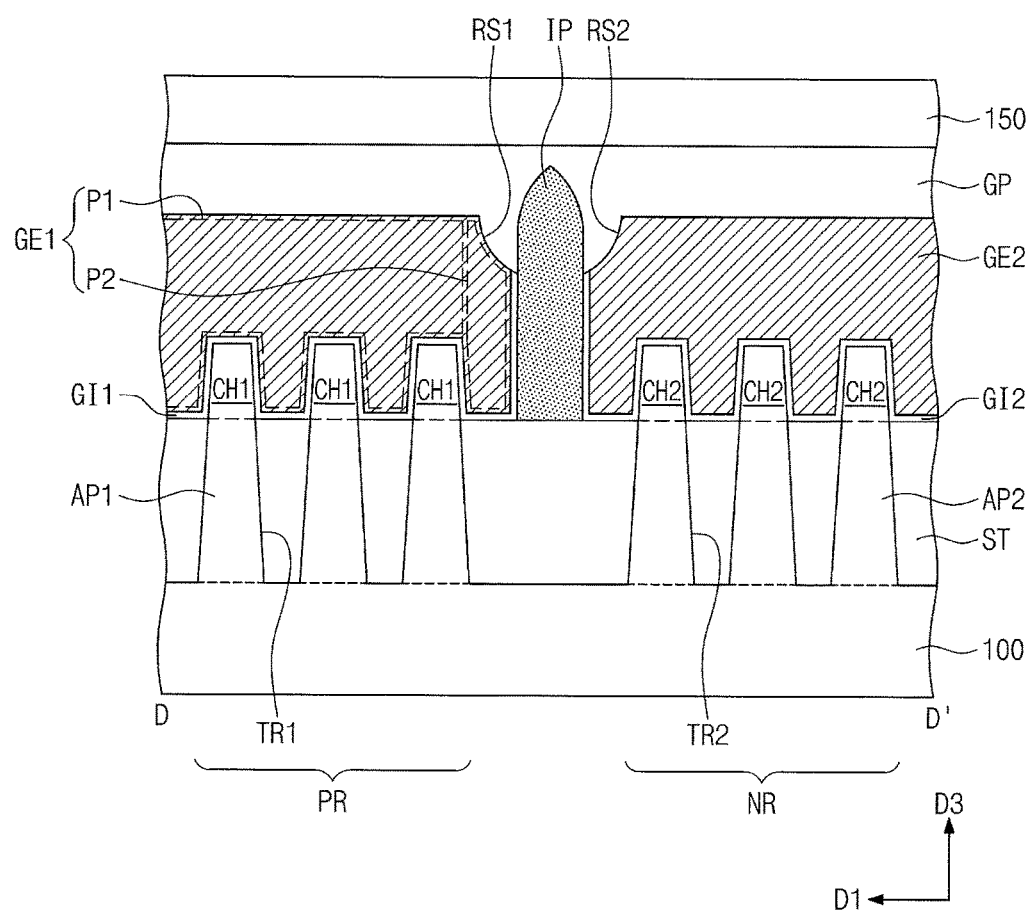
Figure 2E:
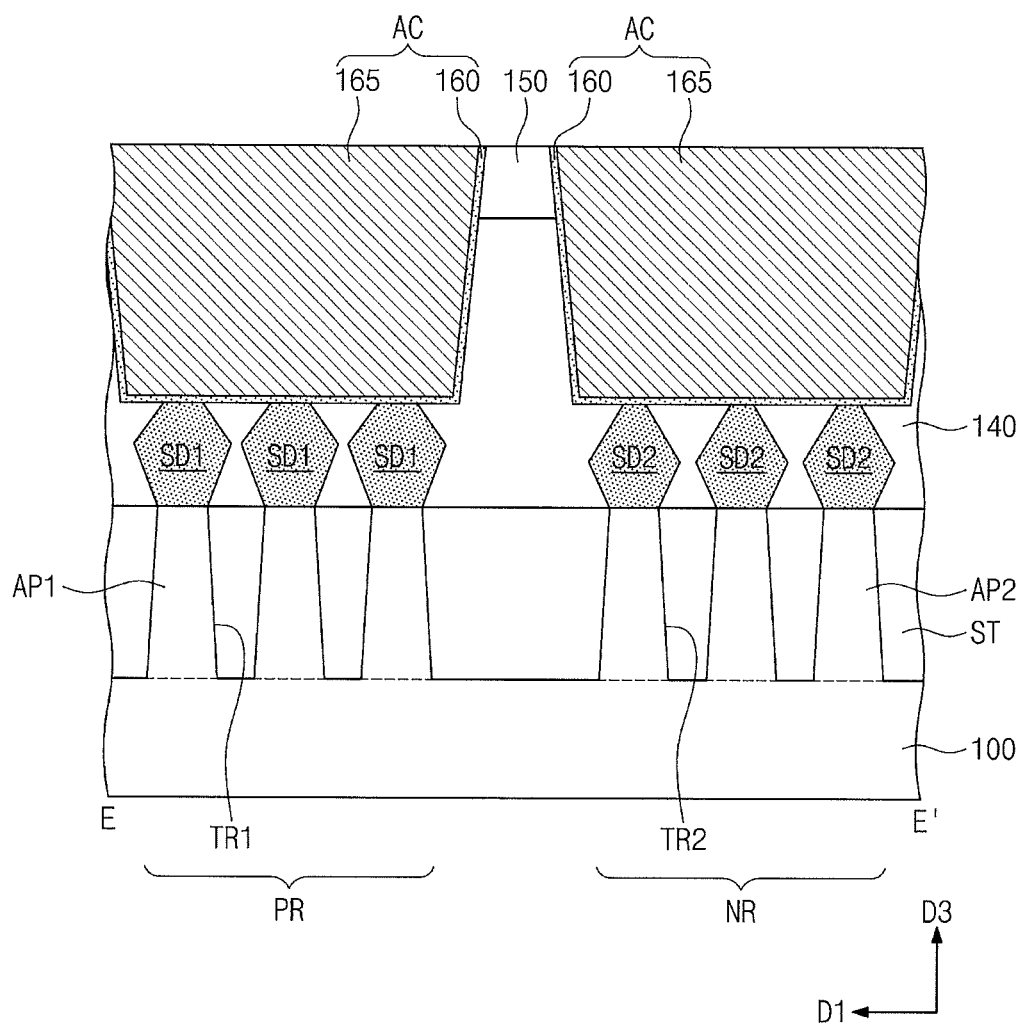
Figure 3:
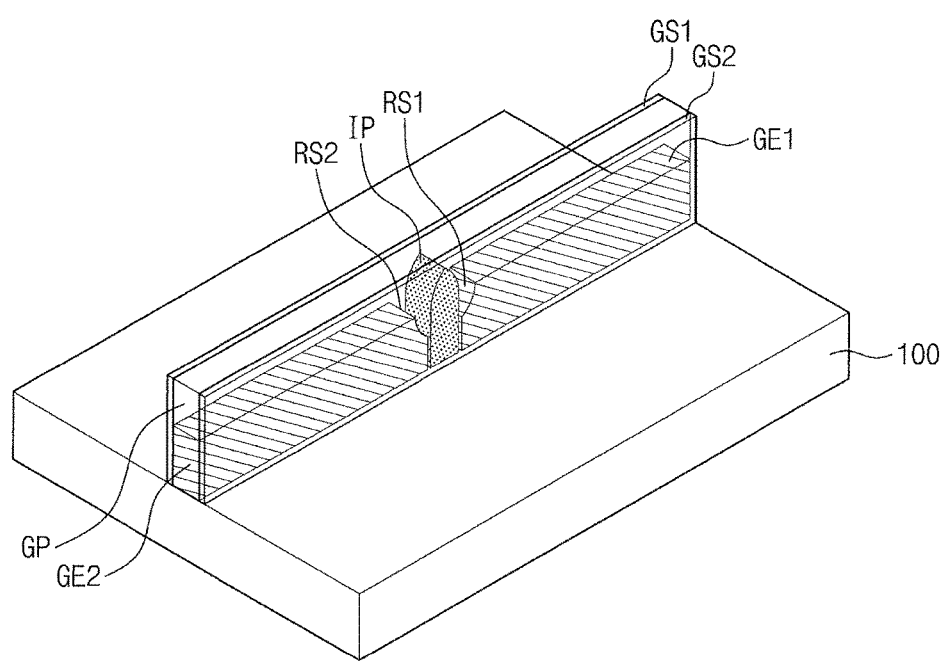
FIG. 3 is a perspective view illustrating first and second gate electrodes and an insulation pattern according to exemplary embodiments of the present inventive concept.

In a semiconductor device according to embodiments of the present inventive concept, in contrast to the comparative example discussed above with reference to FIGS. 4A and 4B, the first and second gate electrodes GE1 and GE2 may respectively include the first and second recessed top portions RS1 and RS2 adjacent to the insulation pattern IP as shown for example in FIG. 2D. In this configuration, the likelihood of an electrical short between one of the first and second gate electrodes GE1 and GE2 and the active contact AC adjacent to the insulation pattern IP may be reduced. Consequently, reliability may be enhanced in a semiconductor device according to embodiments of the present inventive concept.

Figure 16A:
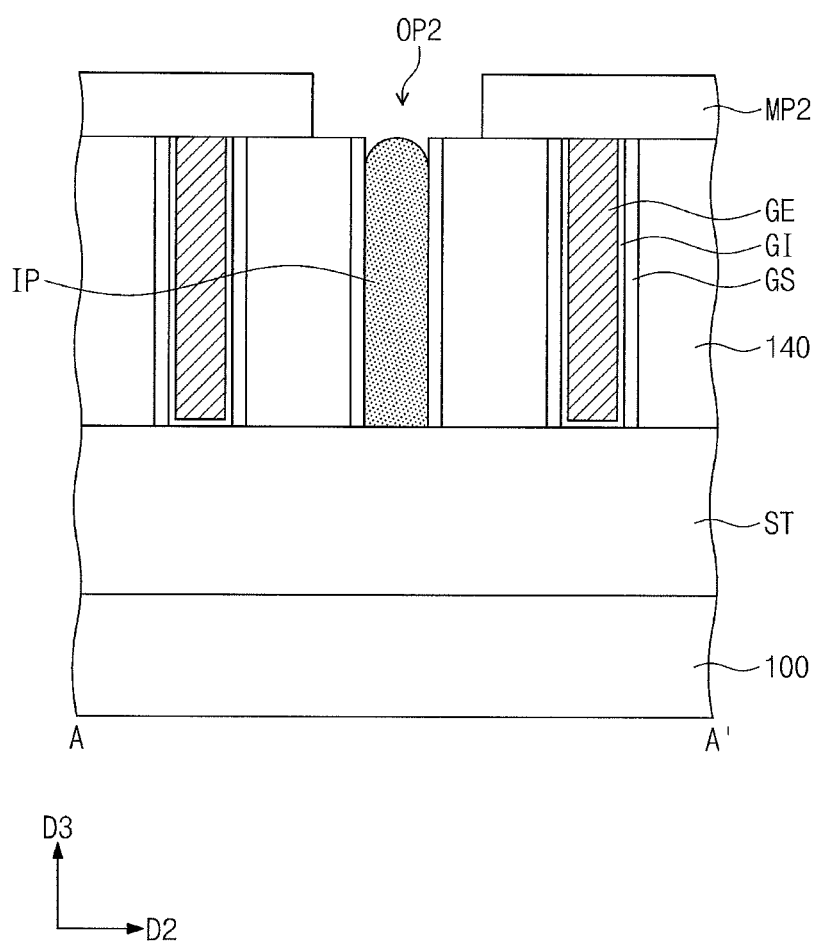
Figure 16B:
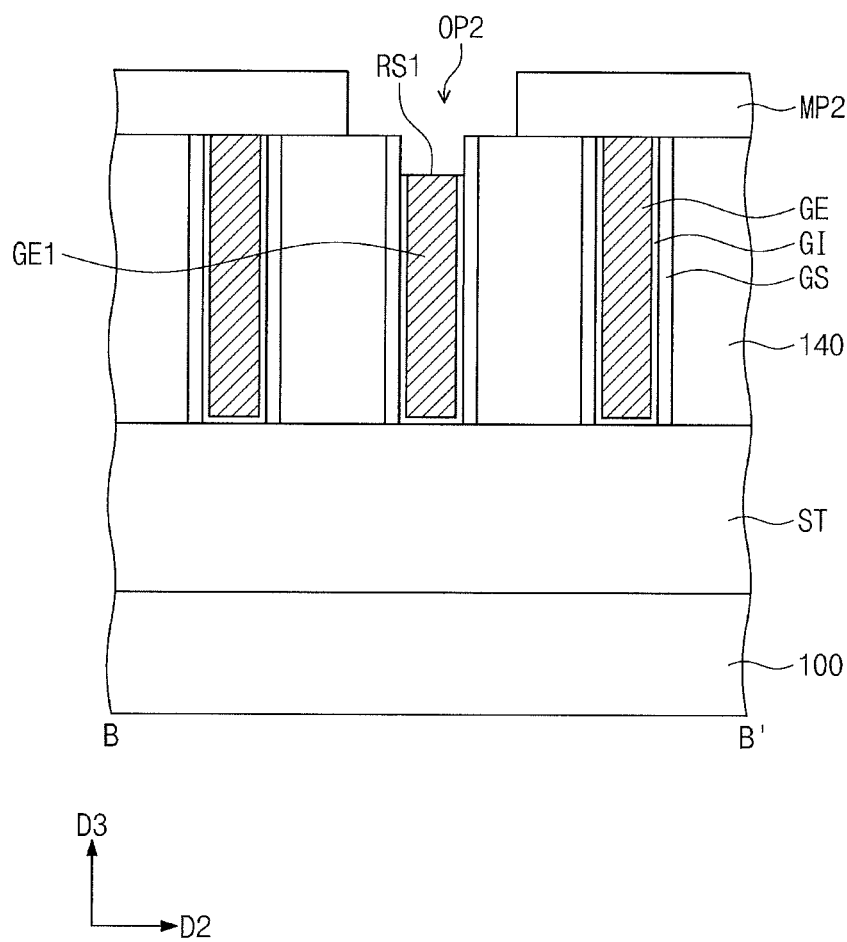
Figure 16C:
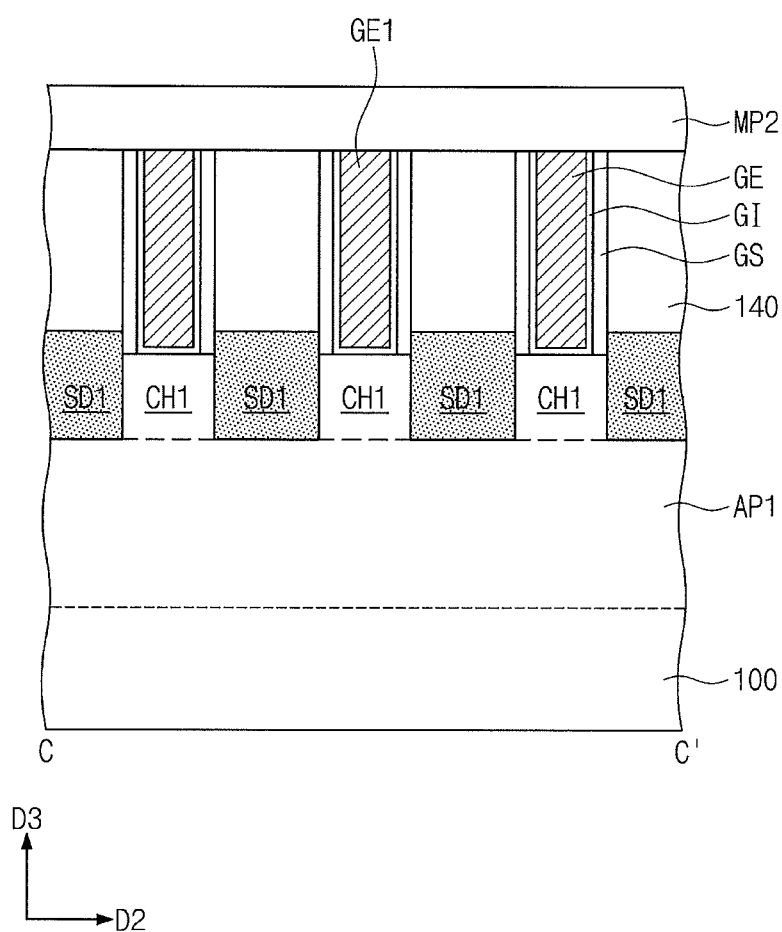
Figure 16D:
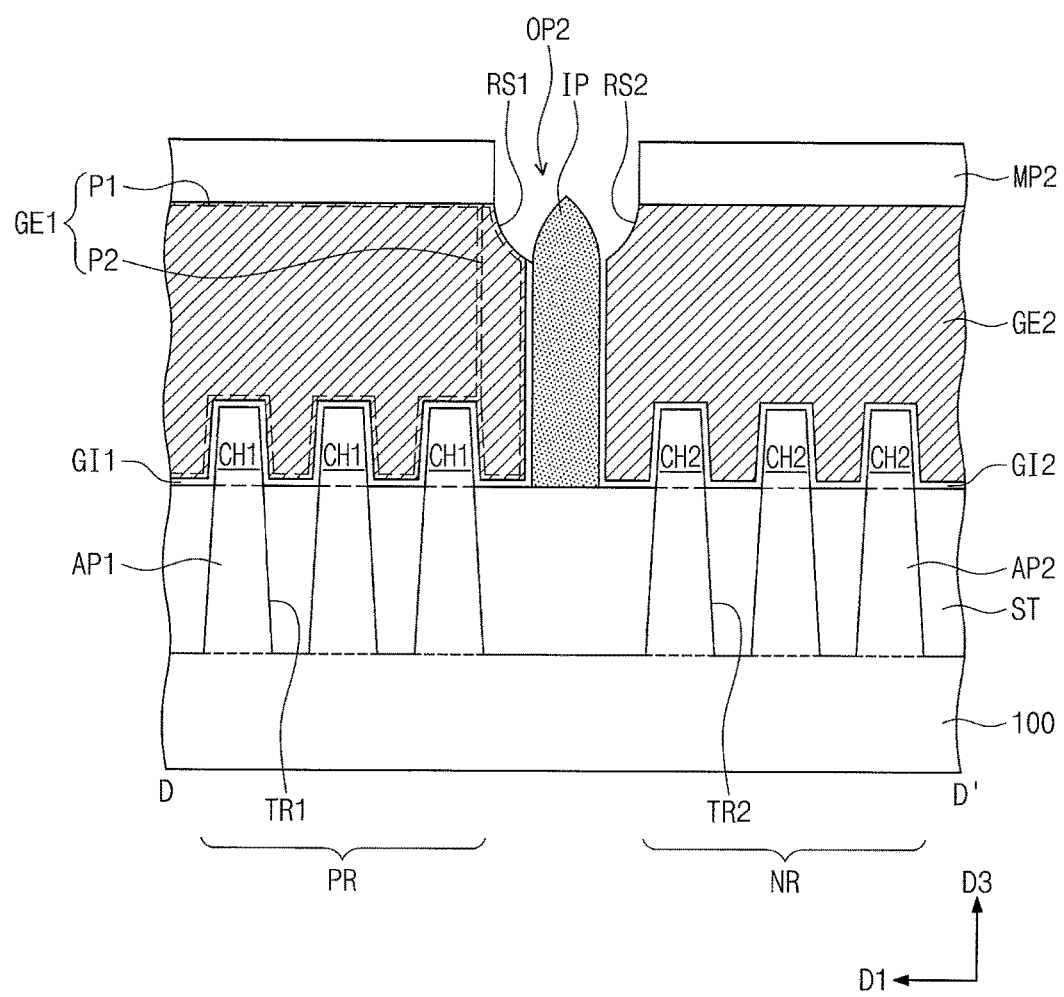
Figure 16E:
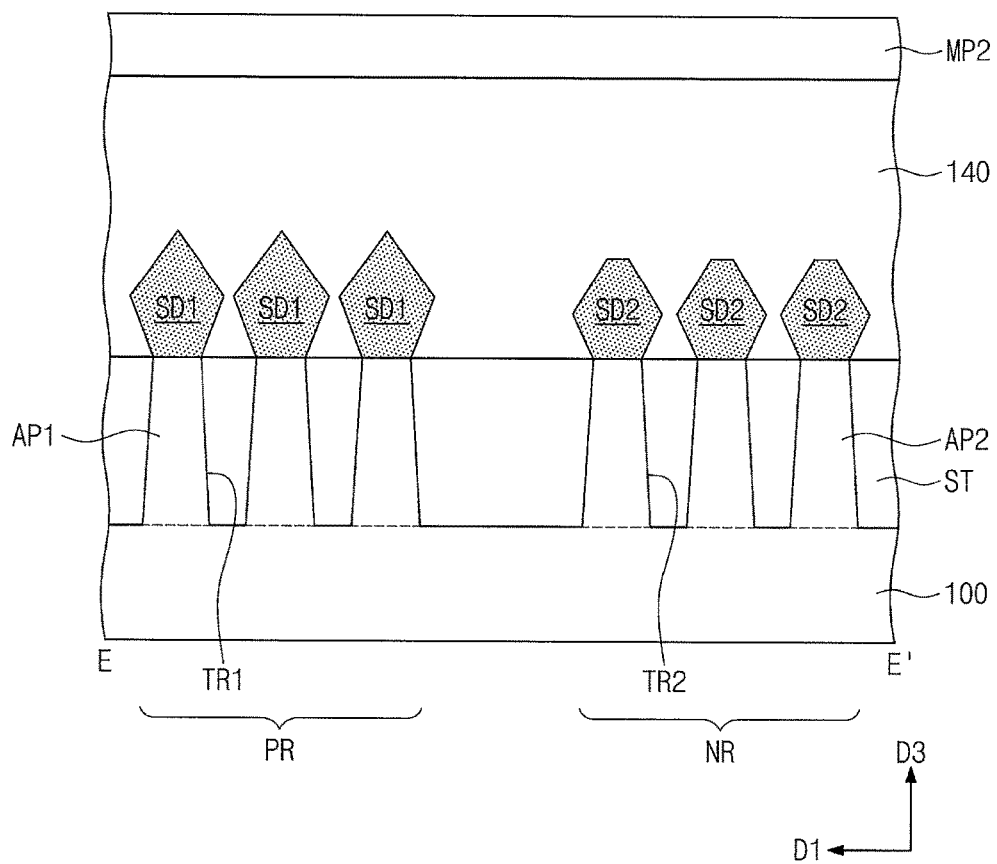
FIG. 16E is a cross-sectional view taken along line E-E' of FIG. 15.

FIGS. 5, 7, 9, 11, 13, and 15 are plan views for explaining a method of manufacturing a semiconductor device according to exemplary embodiments of the present inventive concept. FIGS. 6A, 8A, 10A, 12A, 14A, and 16A are cross-sectional views taken along line A-A' of FIGS. 5, 7, 9, 11, 13, and 15, respectively. FIGS. 6B, 8B, 10B, 12B, 14B, and 16B are cross-sectional views taken along line B-B' of FIGS. 5, 7, 9, 11, 13, and 15, respectively. FIGS. 6C, 8C, 10C, 12C, 14C, and 16C are cross-sectional views taken along line C-C' of FIGS. 5, 7, 9, 11, 13, and 15, respectively. FIGS. 8D, 10D, 12D, 14D, and 16D are cross-sectional views taken along line D-D' of FIGS. 7, 9, 11, 13, and 15, respectively. FIG. 16E is a cross-sectional view taken along line E-E' of FIG. 15.

Referring to FIGS. 5 and 6A to 6C, a substrate 100 may be patterned to form active patterns AP1 and AP2. The active patterns AP1 and AP2 may include first active patterns AP1 and second active patterns AP2. In detail, the formation of the first and second active patterns AP1 and AP2 may include forming mask patterns on the substrate 100 and anisotropically etching the substrate 100 using the mask patterns as an etch mask. First trenches TR1 may be formed between the first active patterns AP1. Second trenches TR2 may be formed between the second active patterns AP2. The substrate 100 may be a compound semiconductor substrate or a semiconductor substrate including silicon, germanium, silicon-germanium, etc.

Device isolation layers ST may be formed to fill the first and second trenches TR1 and TR2. In detail, an insulation layer (e.g., a silicon oxide layer) may be formed to fill all of the first and second trenches TR1 and TR2. Thereafter, the insulation layer may be recessed until exposing upper portions of the first and second active patterns AP1 and AP2. The first active patterns AP1 may form a PMOSFET region PR, and the second active patterns AP2 may form an NMOSFET region NR.

A liner layer EG may be formed on an entire surface of the substrate 100. The liner layer EG may cover top surfaces of the device isolation layers ST. The upper portions of the first and second active patterns AP1 and AP2 may be exposed between the device isolation layers ST, and the liner layer EG may cover the exposed upper portions of the first and second active patterns AP1 and AP2. For example, the liner layer EG may include a silicon oxide layer.

Referring to FIGS. 7 and 8A to 8D, sacrificial patterns SP may be formed to run across the first and second active patterns AP1 and AP2. The sacrificial patterns SP may be formed to have a linear or bar shape extending in a first direction D1. In detail, the formation of the sacrificial patterns SP may include forming a sacrificial layer on the entire surface of the substrate 100 and patterning the sacrificial layer. The sacrificial layer may include a polysilicon layer.

A pair of gate spacers GS may be formed on opposite sidewalls of each of the sacrificial patterns SP. The formation of the gate spacers GS may include conformally forming a spacer layer on the entire surface of the substrate 100 and anisotropically etching the spacer layer. The spacer layer may include at least one of $SiO_2$, SiCN, SiCON, and SiN. Alternatively, the spacer layer may include multiple layers including, for example, two or more of $SiO_2$, SiCN, SiCON, and SiN.

First and second source/drain regions SD1 and SD2 may be formed on opposite sides of each of the sacrificial patterns SP. The first and second source/drain regions SD1 and SD2 may be formed by a selective epitaxial growth process that uses the substrate 100 as a seed layer. For example, the selective epitaxial growth process may include chemical vapor deposition (CVD) or molecular beam epitaxy (MBE).

An etch process may be first performed to selectively etch the first and second active patterns AP1 and AP2 on the opposite sides of each of the sacrificial patterns SP. An etched upper portion of the first active pattern AP1 may be used as a seed layer from which the first source/drain region SD1 may be formed, and likewise, an etched upper portion of the second active pattern AP2 may be used as a seed layer from which the second source/drain region SD2 may be formed. As the first source/drain regions SD1 are formed, a first channel region CH1 may be defined between a pair of the first source/drain regions SD1. Likewise, as the second source/drain regions SD2 are formed, a second channel region CH2 may be defined between a pair of the second source/drain regions SD2.

The first source/drain regions SD1 may be doped with p-type impurities, and the second source/drain regions SD2 may be doped with n-type impurities. For example, impurities may be in-situ doped when the first and second source/drain regions SD1 and SD2 are formed. Alternatively, after the first and second source/drain regions SD1 and SD2 are formed, impurities may be doped into the first and second source/drain regions SD1 and SD2.

Successively, a first interlayer dielectric layer 140 may be formed to cover the first and second source/drain regions SD1 and SD2, the sacrificial patterns SP, and the gate spacers GS. For example, the first interlayer dielectric layer 140 may include a silicon oxide layer. After that, the first interlayer dielectric layer 140 may be planarized until exposing top surfaces of the sacrificial patterns SP. An etch-back or chemical mechanical polishing (CMP) process may be performed to planarize the first interlayer dielectric layer 140. As a result, the first interlayer dielectric layer 140 may have a top surface substantially coplanar with the top surfaces of the sacrificial patterns SP and top surfaces of the gate spacers GS.

An etch stop layer 145 may be formed on the first interlayer dielectric layer 140. The etch stop layer 145 may cover the top surfaces of the sacrificial patterns SP. For example, the etch stop layer 145 may include a silicon nitride layer.

Referring to FIGS. 9 and 10A to 10D, a first mask pattern MP1 having a first opening OP1 may be formed on the etch stop layer 145. The formation of the first mask pattern MP1 may include forming a first mask layer on the etch stop layer 145, forming a photoresist pattern on the first mask layer, and etching the first mask layer using the photoresist pattern as an etch mask. The first opening OP1 may define a position of the insulation pattern IP discussed above with reference to FIGS. 1, 2A to 2E, and 3. The first opening OP1 may be formed on the device isolation layer ST between the PMOSFET and NMOSFET regions PR and NR.

The first mask pattern MP1 may be used as an etch mask to etch the etch stop layer 145 and an upper portion of the sacrificial pattern SP. In this step, the first interlayer dielectric layer 140 and the gate spacers GS may also be partially etched. The first opening OP1 may partially expose the top surface of the sacrificial pattern SP.

An anisotropic etching process may be performed on the sacrificial pattern SP exposed through the first opening OP1. The anisotropic etching process may selectively remove an exposed portion of the sacrificial pattern SP. When the removal of the sacrificial pattern SP is done, the liner layer EG may be in turn exposed through the first opening OP1 and then selectively removed. The first opening OP1 may partially expose the top surface of the device isolation layer ST. The first opening OP1 may divide the sacrificial pattern SP into a first sacrificial pattern SP1 and a second sacrificial pattern SP2. The first and second sacrificial patterns SP1 and SP2 may be spaced apart from each other in the first direction D1 across the first opening OP1. The first sacrificial pattern SP1 may run across the first active patterns AP1, and the second sacrificial pattern SP2 may run across the second active patterns AP2.

Referring to FIGS. 11 and 12A to 12D, an insulation pattern IP may be formed by filling the first opening OP1. The insulation pattern IP may be formed using a deposition process exhibiting superior gap-fill characteristics (e.g., ALD or CVD). For example, the insulation pattern IP may include silicon nitride or silicon oxynitride.

A planarization process may be performed until exposing the top surfaces of the sacrificial patterns SP. The planarization process may remove the first mask pattern MP1 and the etch stop layer 145. The planarization process may be performed such that the insulation pattern IP may have a top surface substantially coplanar with the top surfaces of the sacrificial patterns SP and the top surface of the first interlayer dielectric layer 140. The insulation pattern IP may be interposed between the first and second sacrificial patterns SP1 and SP2.

Referring to FIGS. 13 and 14A to 14D, the sacrificial patterns SP may be replaced by gate electrodes GE. For example, the first and second sacrificial patterns SP1 and SP2 may be respectively replaced by first and second gate electrodes GE1 and GE2.

In detail, an anisotropic etching process may be performed on the exposed sacrificial patterns SP. The anisotropic etching process may selectively etch the sacrificial patterns SP. The insulation pattern IP and the first interlayer dielectric layer 140 may remain during the anisotropic etching process. The liner layer EG may be removed from hollow spaces where the sacrificial patterns SP are removed.

A gate dielectric pattern GI and the gate electrode GE may be formed in each of the hollow spaces. The gate dielectric pattern GI may be conformally formed so as not to completely fill the hollow space. The gate dielectric pattern GI may be formed by an atomic layer deposition (ALD) or chemical oxidation process. For example, the gate dielectric pattern GI may include a high-k dielectric material. The high-k dielectric material may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrode GE may be formed by forming, on the gate dielectric pattern GI, a gate electrode layer completely filling the hollow space and then planarizing the gate electrode layer. For example, the gate electrode layer may include at least one of conductive metal nitride (e.g., titanium nitride or tantalum nitride) and metal (e.g., titanium, tantalum, tungsten, copper, or aluminum).

Referring to FIGS. 15 and 16A to 16E, a second mask pattern MP2 having a second opening OP2 may be formed on the first interlayer dielectric layer 140. The second opening OP2 of the second mask pattern MP2 may expose a top surface of the insulation pattern IP, a portion of a top surface of the first gate electrode GE1, and a portion of a top surface of the second gate electrode GE2.

For example, the first gate electrode GE1 may include a first part P1 extending in the first direction D1 running across the first active patterns AP1 and a second part P2 interposed between the first part P1 and the insulation pattern IP. The second opening OP2 of the second mask pattern MP2 may expose a top surface of the second part P2 of the first gate electrode GE1. The second gate electrode GE2 may also include a first part and a second part. The second opening OP2 of the second mask pattern MP2 may expose a top surface of the second part of the second gate electrode GE2.

The second mask pattern MP2 may be used as an etch mask to etch an upper portion of the second part P2 of the first gate electrode GE1 and an upper portion of the second part of the second gate electrode GE2. The etching process may allow the first and second gate electrodes GE1 and GE2 to have first and second recessed top portions RS1 and RS2, respectively. When the first and second gate electrodes GE1 and GE2 are recessed, first and second gate dielectric patterns GI1 and GI2 may also be recessed.

The etching process may selectively etch the first and second gate electrodes GE1 and GE2 and the first and second gate dielectric patterns GI1 and GI2. In an embodiment, the insulation pattern IP may have an upper portion that is exposed and partially etched during the etching process, so that a round shape may be formed on the upper portion of the insulation pattern IP.

Referring back to FIGS. 1 and 2A to 2E, the second mask pattern MP2 may be removed. Exposed upper portions of the gate electrodes GE may be etched to recess the gate electrodes GE. The recessed gate electrodes GE may have top surfaces lower than those of the first interlayer dielectric layer 140 and the gate spacers GS.

Gate capping patterns GP may be formed on the recessed gate electrodes GE. The formation of the gate capping patterns GP may include forming a gate capping layer to cover the recessed gate electrodes GE and planarizing the gate capping layer until exposing the top surface of the first interlayer dielectric layer 140. For example, the gate capping layer may include at least one of SiON, SiCN, SiCON, and SiN.

A second interlayer dielectric layer 150 may be formed on the first interlayer dielectric layer 140 and the gate capping patterns GP. Active contacts AC may be formed to penetrate the second and first interlayer dielectric layers 150 and 140, so that the first and second source/drain regions SD1 and SD2 may be electrically connected to the active contacts AC.

The active contacts AC may be formed in a self-aligned manner. In detail, contact holes may be formed to expose the first and second source/drain regions SD1 and SD2. The gate electrodes GE may be protected by the gate capping patterns GP and the gate spacers GS during an etching process for forming the contact holes. Even though the contact hole is formed to have a relatively great size, the gate electrode GE may not be exposed but may still be covered with the gate capping patterns GP and the gate spacers GS. A barrier layer 160 and a conductive pillar 165 may be formed to fill each of the contact holes. The barrier layer 160 may include metal layer/metal nitride layer, for example, at least one of Ti/TiN, Ta/TaN, W/WN, Ni/NiN, Co/CoN or Pt/PtN. The conductive pillar 165 may include metal, for example, at least one of aluminum, copper, tungsten, molybdenum or cobalt.

When a semiconductor device is fabricated without the etching process discussed above with reference to FIGS. 15 and 16A to 16E, as discussed with reference to FIGS. 1, 4A, and 4B, the first and second protrusions PP1 and PP2 may respectively remain on the first and second gate electrodes GE1 and GE2. In this case, an electrical short may occur between the first protrusions PP1 and the active contact AC. In contrast, in a method of manufacturing a semiconductor device according to embodiments of the present inventive concept, the first and second recessed top portions RS1 and RS2 may be framed by the etching process discussed above with reference to FIGS. 15 and 16A to 16E. As a result, an electrical short may be prevented between the active contact AC and any one of the first and second gate electrodes GE1 and GE2 in the vicinity of the insulation pattern IP.

Figure 17:
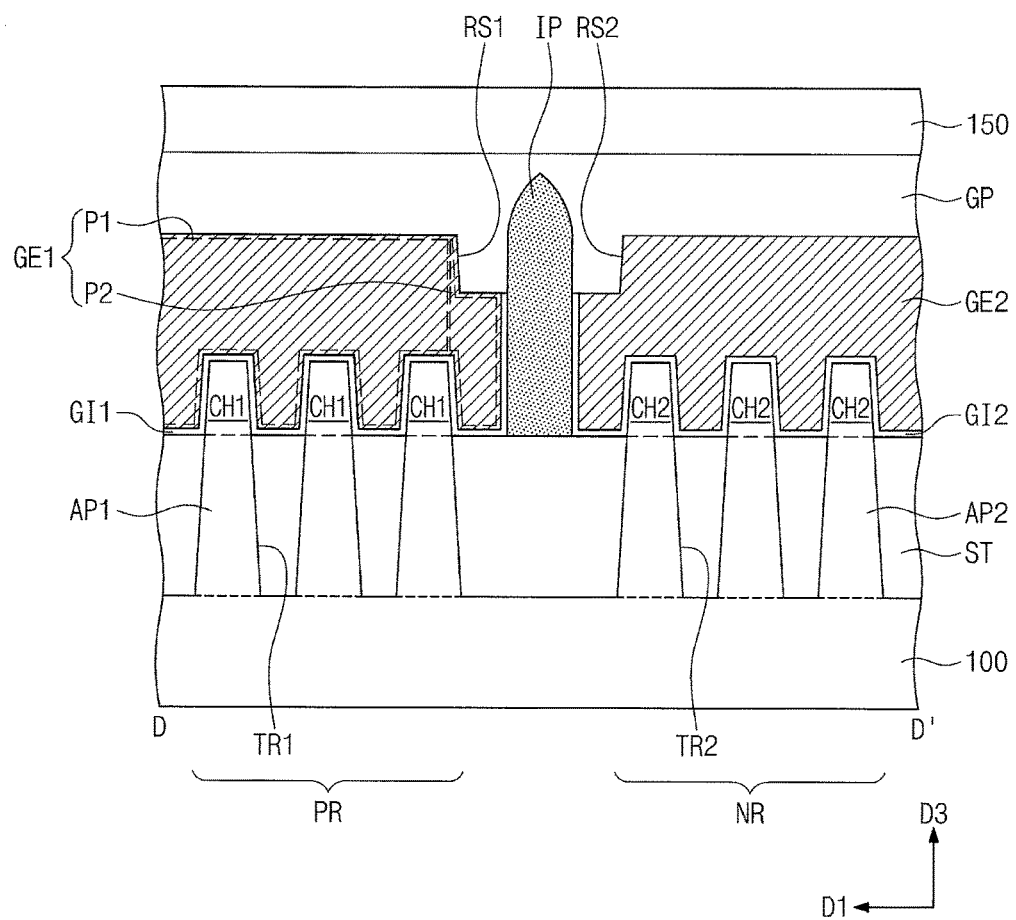
FIGS. 17 and 18 are cross-sectional views each taken along line D-D' of FIG. 1 illustrating a semiconductor device according to exemplary embodiments of the present inventive concept.
Figure 18:
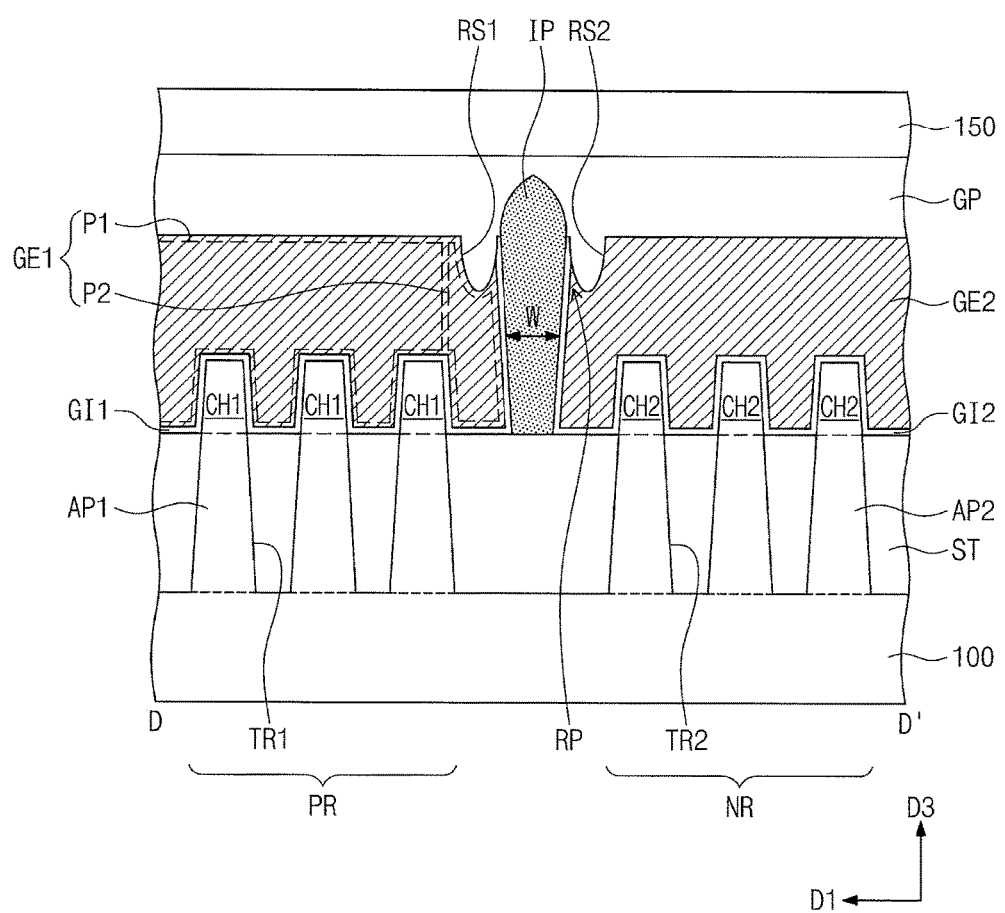

FIGS. 17 and 18 are cross-sectional views each taken along line D-D' of FIG. 1 for explaining a semiconductor device according to exemplary embodiments of the present inventive concept. In the embodiment that follows, a detailed description of technical features discussed with reference to FIGS. 1, 2A to 2E, and 3 are omitted and differences are discussed in more detail.

In some embodiments according to the inventive concept, referring to FIGS. 1, 2A to 2C, 2E, and 17, the first and second recessed top portions RS1 and RS2 may have a staircase (or stepped) profile. As viewed in a cross-section in the first direction D1, the first and second recessed top portions RS1 and RS2 may have an "L" shape. For example, the top surface of the second part P2 of the first gate electrode GE1 may have a height that markedly decreases as the first gate electrode GE1 extends from the first part P1 that is remote from the insulation pattern IP to proximate to the insulation pattern IP.

In some embodiments according to the inventive concept, referring to FIGS. 1, 2A to 2C, 2E, and 18, the insulation pattern IP may have a width W that gradually decreases with approaching the substrate 100. The first gate electrode GE1 may have a remaining part RP on a sidewall of the insulation pattern IP, and the second gate electrode GE2 may have a remaining part RP on an opposite sidewall of the insulation pattern IP. For example, the top surface of the second part P2 of the first gate electrode GE1 may have a height that decreases as the first gate electrode GE1 extends from the first part P1 that is remote from the insulation pattern IP toward the insulation pattern IP and again increases after passing an inflection point at a bottom of the recess RS1 and RS2.

In a semiconductor device according to the present inventive concept, the gate electrode may have the recessed top portion. As a result, an electrical short may be prevented between the gate electrode and the active contact.

Although exemplary embodiments of the present inventive concept have been discussed with reference to accompanying figures, it will be understood that various changes in form and details may be made therein without departing from the spirit and scope of the present inventive concept. It therefore will be understood that the embodiments described above are just illustrative but not limitative in all aspects.

What is claimed:

1. A semiconductor device, comprising:
   a first active pattern and a second active pattern on a substrate;
   a first gate electrode and a second gate electrode respectively extending across the first active pattern and the second active pattern;
   an insulation pattern located between the first and second gate electrodes to separate the first and second gate electrodes from one another, and
   a device isolation layer filling a trench between the first and second active patterns and covering lower sidewalls of the first and second active patterns,
   wherein the first gate electrode, the insulation pattern, and the second gate electrode are arranged along a first direction, and
   wherein the first gate electrode comprises:
   a first part extending in the first direction; and
   a second part between the first active pattern and the insulation pattern, the second part including a top surface having a height lower than a height of a top surface of the first part closest to the second part,
   wherein the second part vertically overlaps with the device isolation layer, and
   wherein the height of the top surface of the second part decreases with approaching the insulation pattern from the first part and then increases again after reaching an inflection point in the top surface of the second part.

2. The semiconductor device of claim 1, wherein the height of the top surface of the second part decreases with approaching the insulation pattern from the first part.

3. The semiconductor device of claim 1, wherein the height of the top surface of the second part decreases with approaching the insulation pattern from the first part and then increases again after reaching an inflection point in the top surface of the second part.

4. The semiconductor device of claim 1, wherein the insulation pattern vertically overlaps with the device isolation layer.

5. The semiconductor device of claim 1, further comprising a pair of gate spacers extending in the first direction, wherein the first gate electrode, the insulation pattern, and the second gate electrode are interposed between the pair of gate spacers.

6. The semiconductor device of claim 1, further comprising a gate dielectric pattern interposed between the first active pattern and the first gate electrode and between the insulation pattern and the first gate electrode.

7. The semiconductor device of claim 1, further comprising:
   a gate capping pattern covering a top surface of the insulation pattern and top surfaces of the first and second gate electrodes; and
   an active contact extending toward the substrate and covering a portion of the gate capping pattern on the first gate electrode,
   wherein each of the first and second active patterns comprises a channel region and a pair of source/drain regions-spaced apart from each other across the channel region, and wherein the active contact is electrically connected to at least one source/drain region of the first active pattern.

8. The semiconductor device of claim 1, wherein the first active pattern and the first gate electrode form a PMOSFET, and the second active pattern and the second gate electrode form an NMOSFET.

9. The semiconductor device of claim 1, wherein the first gate electrode surrounds a top surface and opposite sidewalls of the first active pattern, and
the second gate electrode surrounds a top surface and opposite sidewalls of the second active pattern.

10. A semiconductor device, comprising:
a PMOSFET region and an NMOSFET region on a substrate;
a first gate electrode extending across the PMOSFET region;
a second gate electrode extending across the NMOSFET region; and
an insulation pattern located between the first and second gate electrodes,
wherein each of the first and second gate electrodes includes a recessed top portion adjacent to the insulation pattern relative to respective portions of the first and second gate electrodes that are remote from the insulation pattern,
wherein an upper portion of the insulation pattern vertically protrudes beyond the top portion of each of the first and second gate electrodes, and
wherein the upper portion has a width that decreases in a direction away from the substrate.

11. The semiconductor device of claim 10, wherein a height of the recessed top portion of each of the first and second gate electrodes decreases with approaching the insulation pattern.

12. The semiconductor device of claim 10, wherein a lower portion of the insulation pattern has a width that decreases with approaching the substrate.

13. The semiconductor device of claim 10, further comprising:
a gate capping pattern covering a top surface of the insulation pattern and top surfaces of the first and second gate electrodes; and
an active contact extending toward the substrate and covering a portion of the gate capping pattern on the first gate electrode.

14. A semiconductor device, comprising:
a first active pattern on a substrate, the first active pattern including a plurality of first active regions that protrude from the substrate;
a second active pattern on the substrate including a plurality of second active regions that protrude from the substrate;
a first gate electrode including an upper portion that extends over the first active pattern at a first height and including a recessed portion that extends over the first active pattern at a second height that is lower than the first height of the first gate electrode;
a second gate electrode including an upper portion that extends over the second active pattern at a first height and including a recessed portion that extends over the second active pattern at a second height that is lower than the first height of the second gate electrode; and
an insulation pattern located between, and directly adjacent to, the recessed portion of the first gate electrode and the recessed portion of the second gate electrode, the insulation pattern electrically isolating the first and second gate electrodes from one another,
wherein an upper portion of the insulation pattern vertically protrudes beyond the recessed portions of the first and second gate electrodes, and
wherein the upper portion has a width that decreases in a direction away from the substrate.

15. The semiconductor device of claim 14 wherein the first and second gate electrodes extend in a first direction on the substrate, the recessed portion of the first gate electrode or the recessed portion of the second gate electrode including a curved upper surface that curves toward the insulation pattern to the second height.

16. The semiconductor device of claim 15 wherein the second height is located in the curved upper surface closest to the insulation pattern.

17. The semiconductor device of claim 15 wherein the second height is located in the curved upper surface at inflection point.

18. The semiconductor device of claim 14 wherein the first and second gate electrodes extend in a first direction on the substrate, the recessed portion of the first gate electrode or the recessed portion of the second gate electrode including a stepped upper surface that steps down toward the insulation pattern to the second height.

* * * * *